United States Patent
Kato

(10) Patent No.: US 10,249,347 B2
(45) Date of Patent: Apr. 2, 2019

(54) SEMICONDUCTOR DEVICE AND METHOD FOR DRIVING SEMICONDUCTOR DEVICE

(71) Applicant: SEMICONDUCTOR ENERGY LABORATORY CO., LTD., Atsugi-shi, Kanagawa-ken (JP)

(72) Inventor: Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/539,067

(22) Filed: Nov. 12, 2014

(65) Prior Publication Data
US 2015/0131367 A1 May 14, 2015

(30) Foreign Application Priority Data
Nov. 13, 2013 (JP) .................. 2013-234761

(51) Int. Cl.
*G11C 14/00* (2006.01)
*G11C 5/14* (2006.01)
(Continued)

(52) U.S. Cl.
CPC ............ *G11C 5/147* (2013.01); *G11C 11/404* (2013.01); *G11C 11/4074* (2013.01); *G11C 14/0054* (2013.01)

(58) Field of Classification Search
CPC .................................................. G11C 14/0054
(Continued)

(56) References Cited

U.S. PATENT DOCUMENTS

| 4,809,225 A | * | 2/1989 | Dimmler ................. G11C 11/22 365/149 |
| 4,965,769 A | * | 10/1990 | Etoh ....................... G11C 7/20 365/149 |

(Continued)

FOREIGN PATENT DOCUMENTS

| EP | 1737044 A | 12/2006 |
| EP | 2226847 A | 9/2010 |

(Continued)

OTHER PUBLICATIONS

Kamiya et al., Present status of amorphous In—Ga—Zn—O thin film transistors, Science and Technology of Advanced Materials, vol. 11, No. 4, p. 044305, Aug. 2010.*

(Continued)

*Primary Examiner* — Hoai V Ho
*Assistant Examiner* — Jay Radke
(74) *Attorney, Agent, or Firm* — Fish & Richardson P.C.

(57) ABSTRACT

A normally-off state of an OS transistor is maintained or an on-state current thereof is increased without additionally generating a positive potential or a negative potential. When data is written to a node connecting an OS transistor and a capacitor, a potential supplied to the other side of the capacitor is set to an L level, and when the data is retained, the potential is switched from the L level to an H level. In addition, a power switch for a volatile memory circuit is provided on a low power supply potential side so that the supply of a power supply voltage can be stopped. Accordingly, at the time of data retention, a source and a drain of the OS transistor can be set at a high potential, whereby the normally-off state can be maintained and the on-state current can be increased.

15 Claims, 19 Drawing Sheets

(51) Int. Cl.
  *G11C 11/404* (2006.01)
  *G11C 11/4074* (2006.01)

(58) Field of Classification Search
  USPC .................................................. 365/149, 228
  See application file for complete search history.

(56) References Cited

U.S. PATENT DOCUMENTS

| | | | |
|---|---|---|---|
| 5,381,373 A * | 1/1995 | Ohsawa | G11C 29/50 365/193 |
| 5,471,421 A | 11/1995 | Rose et al. | |
| 5,574,681 A * | 11/1996 | Foss | G11C 7/12 365/149 |
| 5,581,500 A | 12/1996 | D'Souza | |
| 5,583,821 A | 12/1996 | Rose et al. | |
| 5,654,913 A | 8/1997 | Fukushima et al. | |
| 5,731,856 A | 3/1998 | Kim et al. | |
| 5,744,864 A | 4/1998 | Cillessen et al. | |
| 6,249,476 B1 * | 6/2001 | Yamazaki | G11C 7/10 365/230.03 |
| 6,285,575 B1 * | 9/2001 | Miwa | G11C 11/22 365/145 |
| 6,294,274 B1 | 9/2001 | Kawazoe et al. | |
| 6,414,868 B1 * | 7/2002 | Wong | G11C 5/04 365/193 |
| 6,563,174 B2 | 5/2003 | Kawasaki et al. | |
| 6,707,702 B1 * | 3/2004 | Komatsuzaki | G11C 14/00 365/145 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,362,538 B2 | 1/2013 | Koyama et al. | |
| 8,432,187 B2 | 4/2013 | Kato et al. | |
| 8,593,856 B2 | 11/2013 | Koyama et al. | |
| 8,618,586 B2 | 12/2013 | Koyama et al. | |
| 8,787,102 B2 | 7/2014 | Ishizu | |
| 8,854,867 B2 | 10/2014 | Takemura | |
| 8,994,400 B2 | 3/2015 | Kato et al. | |
| 9,147,462 B2 | 9/2015 | Koyama et al. | |
| 9,224,472 B2 | 12/2015 | Takemura | |
| 9,407,269 B2 | 8/2016 | Koyama et al. | |
| 9,870,816 B2 | 1/2018 | Onuki et al. | |
| 9,941,304 B2 | 4/2018 | Koyama et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0008776 A1 * | 1/2007 | Scheuerlein | G11C 14/0063 365/185.17 |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0156024 A1 | 6/2011 | Koyama et al. | |
| 2011/0176357 A1 | 7/2011 | Koyama et al. | |
| 2012/0286853 A1 | 11/2012 | Seki et al. | |
| 2012/0294068 A1 | 11/2012 | Ishizu | |
| 2012/0294102 A1 * | 11/2012 | Ishizu | G11C 11/412 365/203 |
| 2013/0223135 A1 | 8/2013 | Koyama | |
| 2013/0247057 A1 * | 9/2013 | Fujimori | G06F 9/4806 718/102 |
| 2013/0314976 A1 | 11/2013 | Onuki | |
| 2015/0117093 A1 | 4/2015 | Onuki et al. | |
| 2015/0200657 A1 | 7/2015 | Kato et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |

(56) References Cited

FOREIGN PATENT DOCUMENTS

| | | |
|---|---|---|
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 08-279285 A | 10/1996 |
| JP | 09-120681 A | 5/1997 |
| JP | 09-321600 A | 12/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-151796 A | 8/2011 |
| JP | 2011-171723 A | 9/2011 |
| JP | 2012-231462 A | 11/2012 |
| JP | 2013-008436 A | 1/2013 |
| JP | 2013-008437 A | 1/2013 |
| JP | 2015-111485 A | 6/2015 |
| WO | WO-2004/114391 | 12/2004 |
| WO | WO-2011/070905 | 6/2011 |
| WO | WO-2011/078373 | 6/2011 |
| WO | WO-2011/089847 | 7/2011 |
| WO | WO-2011/104789 | 9/2011 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTS Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,$YbFe_2O_4$, and $Yb_2Fe_3O_7$ Types of Structures for Compounds in the $In_2O_3$ and $Sc_2O_3$—$A_2O_3$—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (M=7, 8, 9, and 16) in the $In_2O_3$—$ZnGa_2O_4$—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ohara.H et al., "21.3:4.0 IN. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-IN. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator" Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Kobayashi.H et al., "Processor with 4.9-μs break-even time in power gating using crystalline In—Ga—Zn—oxide transistor", Cool Chips XVI, Apr. 17, 2013, pp. 1-3.

* cited by examiner

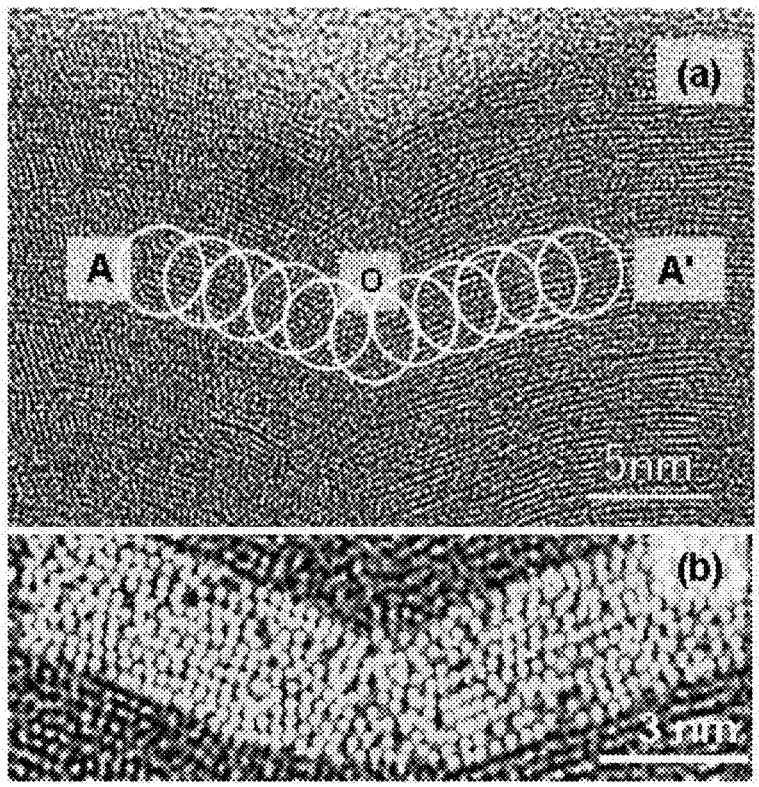
FIG. 13A
FIG. 13B
FIG. 13C
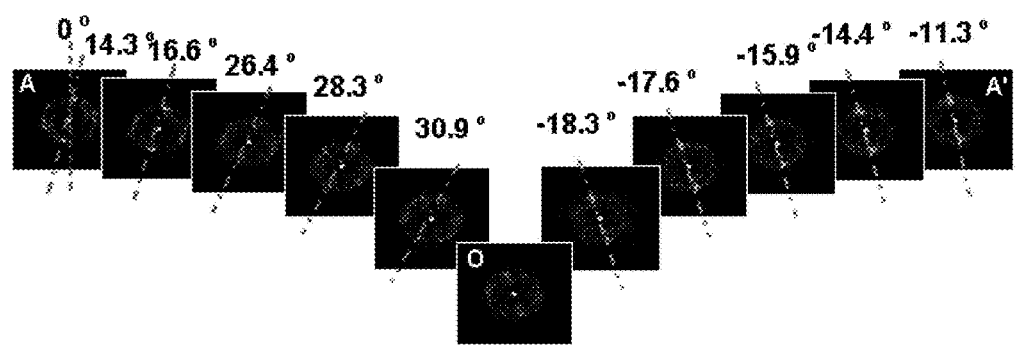

CAAC-OS nc-OS as-sputtered after heat treatment at 450°C

SEMICONDUCTOR DEVICE AND METHOD FOR DRIVING SEMICONDUCTOR DEVICE

BACKGROUND OF THE INVENTION

1. Field of the Invention

One embodiment of the present invention relates to a semiconductor device and a driving method thereof.

Note that one embodiment of the present invention is not limited to the above technical field. The technical field of the invention disclosed in this specification and the like relates to an object, a method, or a manufacturing method. In addition, the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a driving method thereof, and a manufacturing method thereof.

2. Description of the Related Art

Much attention has been focused on a semiconductor device that retains data by using a combination of a transistor in which silicon (Si) is used for a semiconductor layer (hereinafter, Si transistor) and a transistor in which an oxide semiconductor (OS) is used for a semiconductor layer (hereinafter, OS transistor) (see Patent Documents 1 and 2).

REFERENCES

Patent Documents

[Patent Document 1] Japanese Published Patent Application No. 2013-8437
[Patent Document 2] Japanese Published Patent Application No. 2013-8436

SUMMARY OF THE INVENTION

In a semiconductor device with the structure described in Patent Document 1 or 2, charge corresponding to data is retained at a node connecting an OS transistor and a capacitor, so that data can be retained for a long time.

At the time of the data retention, the OS transistor is required to have a small drain current, such as 1 zA ($1\times10^{-21}$ A) or smaller when a gate and a source each have a potential of 0 V and a drain has a positive potential. That is, the OS transistor needs to be a normally-off transistor, which is a transistor having a small current when the voltage between its gate and source (hereinafter, Vgs) is 0 V. A transistor in which a current of more than 1 zA flows at Vgs of 0 V is referred to as a normally-on transistor.

At the time of data backup, a high Vgs is supplied to turn on the OS transistor, and charge on the drain side corresponding to data '1' or '0' is supplied to a node at which data is to be retained; thus, data is written. At this time, the higher the Vgs gets by increasing the potential of the gate, the larger the drain current of the OS transistor. Thus, high-speed data writing can be performed. Note that also in the case where the OS transistor is turned on and data is recovered, it is preferable that the Vgs be increased by increasing the potential of the gate so that the drain current is increased.

However, in the case of a normally-on OS transistor, it is difficult to keep the drain current small even when a low power supply potential (e.g., 0 V (GND)) is supplied to the gate, and it is difficult to retain data for a long time. In such a case, a negative potential smaller than 0 V is supplied to the gate of the OS transistor so that Vgs becomes negative and the drain current is decreased, whereby data can be retained for a long time. To achieve this, an additional power supply circuit is needed to generate a negative potential, which is disadvantageous in terms of increases in circuit area and power consumption.

In contrast, in the case of a normally-off OS transistor, a sufficiently large current (on-state current) cannot be obtained when a high power supply potential (VDD) is supplied to the gate, and data writing becomes slow, which is a problem. This problem becomes more conspicuous as the power supply voltage is reduced and transistors included in a semiconductor device become smaller. When the potential of the gate of the OS transistor is higher than VDD, the on-state current is increased and thus the problem of low writing speed is solved; however, an additional power supply circuit is needed to generate a high potential, which is disadvantageous in terms of increases in circuit area and power consumption.

In view of the above, an object of one embodiment of the present invention is to provide a semiconductor device with a novel structure that can retain data for a long time without additionally generating a negative potential to be supplied to a gate of an OS transistor. Another object of one embodiment of the present invention is to provide a semiconductor device with a novel structure that can increase the on-state current of an OS transistor without additionally generating a potential to increase the on-state current. Another object of one embodiment of the present invention is to provide a semiconductor device or the like with a novel structure.

Note that the descriptions of these objects do not disturb the existence of other objects. In one embodiment of the present invention, there is no need to achieve all the objects. Objects other than the above objects are apparent from and can be derived from the description of the specification, the drawings, the claims, and the like.

One embodiment of the present invention is a semiconductor device including a transistor capable of controlling conduction between a first terminal and a second terminal in accordance with a gate signal supplied to a gate; a volatile memory circuit electrically connected to the first terminal and capable of retaining data in a period during which a high power supply potential and a low power supply potential are supplied to a power supply line; and a capacitor including a first electrode electrically connected to the second terminal and a second electrode electrically connected to a potential control line. Data of the volatile memory circuit is stored by retaining a potential at a node between the transistor and the capacitor. The potential control line is a wiring whose potential is set to an L level in a first period during which the potential of the first terminal is supplied to the second terminal through the transistor in an on state and is switched from the L level to an H level in a second period during which the transistor is turned off. In the second period, each potential of the power supply line supplied to the volatile memory circuit is the high power supply potential.

One embodiment of the present invention is a method for driving a semiconductor device including a transistor capable of controlling conduction between a first terminal and a second terminal in accordance with a gate signal supplied to a gate; a volatile memory circuit electrically connected to the first terminal and capable of retaining data in a period during which a high power supply potential and a low power supply potential are supplied to a power supply line; and a capacitor including a first electrode electrically connected to the second terminal and a second electrode electrically connected to a potential control line. Data of the volatile memory circuit is stored by retaining a potential at a node between the transistor and the capacitor. In the method, the potential of the potential control line is set to an L level to supply the potential of the first terminal to the second terminal through the transistor in an on state, and the transistor is turned off to retain the potential of the first terminal at the second terminal. The potential of the potential control line is switched from the L level to an H level to increase the potential retained at the second terminal. Each potential of the power supply line supplied to the volatile memory circuit is set to the high power supply potential to stop the supply of a power supply voltage.

One embodiment of the present invention can provide a semiconductor device with a novel structure that can retain data for a long time without additionally generating a negative potential to be supplied to a gate of an OS transistor. One embodiment of the present invention can provide a semiconductor device with a novel structure that can increase the on-state current of an OS transistor without additionally generating a potential to increase the on-state current. One embodiment of the present invention can provide a semiconductor device or the like with a novel structure.

Note that the descriptions of these effects do not disturb the existence of other effects. One embodiment of the present invention does not necessarily achieve all the above effects. Other effects will be apparent from and can be derived from the description of the specification, the drawings, the claims, and the like.

BRIEF DESCRIPTION OF THE DRAWINGS

FIGS. 13A to 13C are cross-sectional TEM images and a local Fourier transform image of an oxide semiconductor.

DETAILED DESCRIPTION OF THE INVENTION

Figure 1A:
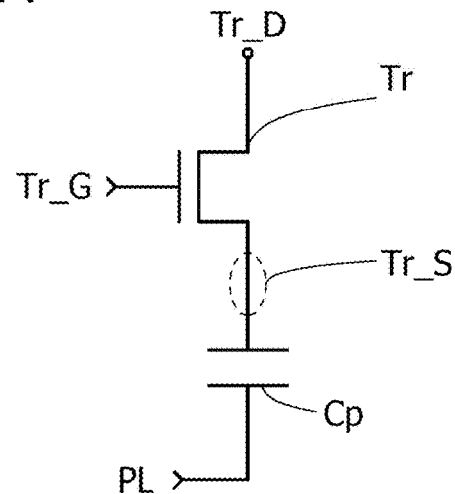
FIGS. 1A and 1B are a circuit diagram and a schematic diagram illustrating one embodiment of the present invention.

Embodiments will be hereinafter described with reference to drawings. However, the embodiments can be implemented with various modes. It will be readily appreciated by those skilled in the art that modes and details can be changed in various ways without departing from the spirit and scope of the present invention. Therefore, the present invention should not be construed as being limited to the description in the following embodiments. In the modes of the present invention described below, the same components in different diagrams are commonly denoted by the same reference numerals.

In drawings, the size, the layer thickness, or the region is exaggerated for clarity in some cases. Therefore, embodiments of the present invention are not limited to such a scale. Note that drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source.

Here, since the source and the drain of the transistor change depending on the structure, the operating condition, and the like of the transistor, it is difficult to define which is a source or a drain. Thus, in some cases, a portion which functions as the source and a portion which functions as the drain are not called a source and a drain, and one of the source and the drain is referred to as a first terminal and the other thereof is referred to as a second terminal.

Note that ordinal numbers such as "first", "second", and "third" in this specification are used in order to avoid confusion among components, and the terms do not limit the components numerically.

Note that in this specification, the phrase "A and B are connected" or "A is connected to B" means the case where A and B are electrically connected to each other as well as the case where A and B are directly connected to each other. Here, the phrase "A and B are electrically connected" or "A is electrically connected to B" means the following case: when an object having any electrical function exists between A and B, an electric signal can be transmitted and received between A and B.

Note that in this specification, terms for describing arrangement, such as "over" and "under", are used for convenience for describing the positional relationship between components with reference to drawings. Further, the positional relationship between components is changed as appropriate in accordance with a direction in which each component is described. Thus, the positional relationship is not limited to that described with a term used in this specification and can be explained with another term as appropriate depending on the situation.

Note that the positional relationships of circuit blocks in diagrams are specified for description, and even in the case where different circuit blocks have different functions in the diagrams, the different circuit blocks might be provided in an actual circuit or region so that different functions are achieved in the same circuit block. The functions of circuit blocks in diagrams are specified for description, and even in the case where one circuit block is illustrated, blocks might be provided in an actual circuit or region so that processing performed by one circuit block is performed by a plurality of circuit blocks.

Note that a voltage refers to a potential difference between a given potential and a reference potential (e.g., a ground potential) in many cases. Therefore, a voltage, a potential, and a potential difference can also be referred to as a potential, a voltage, and a voltage difference, respectively. Note that a voltage refers to the difference between potentials of two points, and a potential refers to electrostatic energy (electric potential energy) of a unit charge at a given point in an electrostatic field.

Note that in general, potential and voltage are relative values. Therefore, ground potential is not always 0 V.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, trigonal and rhombohedral crystal systems are included in a hexagonal crystal system.

Embodiment 1

In this embodiment, a circuit configuration and operation of a semiconductor device according to one embodiment of the disclosed invention will be described with reference to FIGS. 1A and 1B, FIGS. 2A and 2B, FIG. 3, FIGS. 4A and 4B, FIG. 5, FIGS. 6A and 6B, FIGS. 7A and 7B, FIG. 8, FIGS. 9A and 9B, FIG. 10, FIGS. 11A and 11B, and FIG. 12.

Note that a semiconductor device is a device including a semiconductor element. The semiconductor device includes a driver circuit or the like for driving a circuit including a semiconductor element. Note that a semiconductor device may include a driver circuit, a power supply circuit, or the like as well as a circuit having a configuration described as one embodiment of the present invention.

FIG. 1A is a circuit diagram illustrating a semiconductor device of one embodiment of the present invention.

The circuit diagram in FIG. 1A illustrates a transistor Tr and a capacitor Cp. FIG. 1A illustrates a first terminal Tr_D, a gate terminal Tr_G, and a second terminal Tr_S serving as a drain, a gate, and a source of the transistor Tr, respectively. In FIG. 1A, a first electrode of the capacitor Cp is connected to the second terminal Tr_S, and a second electrode of the capacitor Cp is connected to a potential control line PL.

The first terminal Tr_D supplies an H level potential (hereinafter referred to as "H" or "H level") corresponding to data '1' or an L level potential (hereinafter referred to as "L" or "L level") corresponding to data '0' to be retained in a volatile memory circuit. For example, the first terminal Tr_D is electrically connected to a node in a static random access memory (SRAM) or a flip-flop.

In a period during which the data '1' or '0' is stored in the volatile memory circuit, a power supply voltage is supplied to the volatile memory circuit through a power supply line including a wiring that supplies a high power supply potential and a wiring that supplies a low power supply potential.

In the semiconductor device described in this embodiment, a transistor having a small off-state current is used as the transistor Tr.

Unless otherwise specified, the off-state current in this specification refers to a drain current of a transistor in the off state (also referred to as non-conduction state and cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. For this reason, when there is Vgs at which the off-state current of a transistor is lower than or equal to I, it may be said that the off-state current of the transistor is lower than or equal to I. The off-state current of a transistor may refer to off-state current at given Vgs, off-state current at Vgs in a given range, or off-state current at Vgs at which sufficiently low off-state current is obtained.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value in relation to the channel width W or by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is Vgs at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on voltage Vds between its drain and source in some cases. Unless otherwise specified, the off-state current in this specification may be an off-state current at Vds with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured or Vds used in the semiconductor device or the like. When there is Vgs at which the off-state current of a transistor is lower than or equal to I at given Vds, it may be said that the off-state current of the transistor is lower than or equal to I. Here, given Vds is, for example, 0.1 V, 0.8 V, 1 V, 1.2 V, 1.8 V, 2.5 V, 3 V, 3.3 V, 10 V, 12 V, 16 V, 20 V, Vds at which the reliability of a semiconductor device or the like including the transistor is ensured, or Vds used in the semiconductor device or the like.

In the above description of off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

In this embodiment, the high power supply potential is VDD as an example, and the low power supply potential is 0 V (e.g., GND).

In this embodiment, as an example of the transistor Tr having a small off-state current, an OS transistor, which is an n-channel transistor, is used. The n-channel transistor Tr is turned on when the potential supplied to the gate terminal Tr_G is the H level and turned off when the potential is the L level.

When the transistor Tr is turned on, a potential which corresponds to data '1' or '0' and is supplied to the first terminal Tr_D is supplied to the second terminal Tr_S through the transistor Tr. Note that the period during which data at the first terminal Tr_D is supplied to the second terminal Tr_S is referred to as a backup period or a write period.

When the transistor Tr is kept off, the H level or L level potential supplied to the second terminal Tr_S during the backup period can be retained, so that charge accumulated in the capacitor Cp can be retained for a long time. In the period during which the H level or L level potential at the second terminal Tr_S is retained, the supply of the power supply voltage is stopped; thus, the period is referred to as a power-off period or a retention period.

Figure 1B:
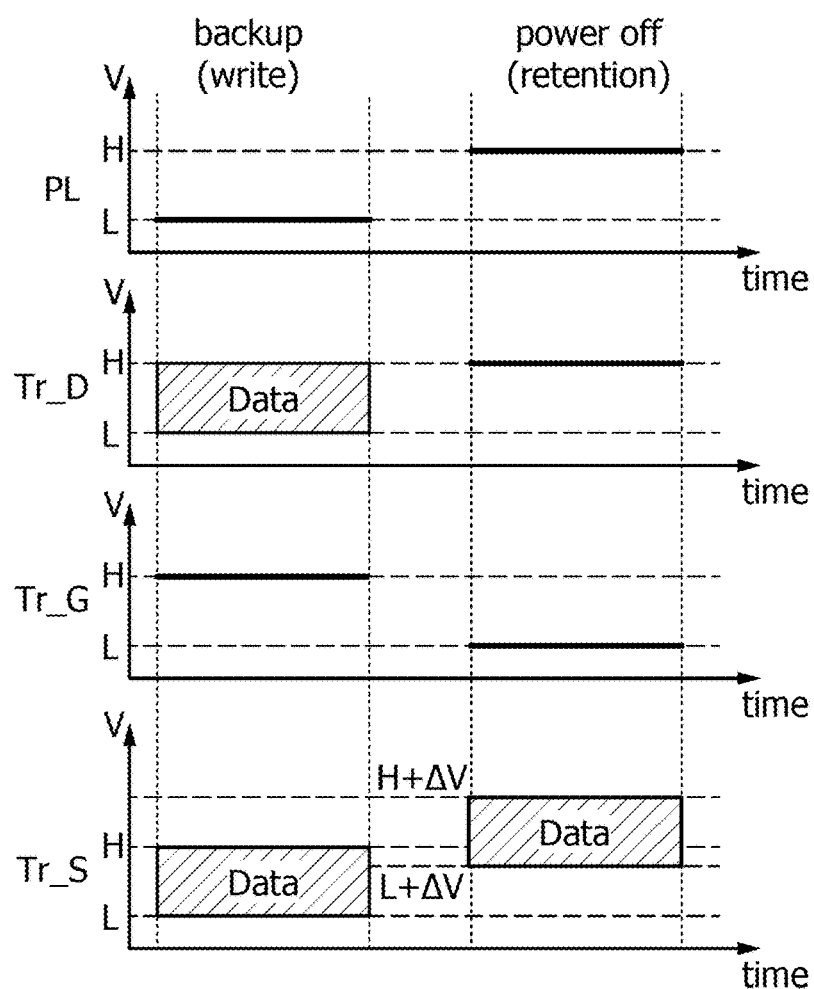

FIG. 1B is a schematic diagram illustrating the operation of the semiconductor device of one embodiment of the present invention. FIG. 1B shows the potentials of the potential control line PL, the first terminal Tr_D, the gate terminal Tr_G, and the second terminal Tr_S in the backup period and the power-off period.

In the backup period shown in FIG. 1B, the gate terminal Tr_G is set at the H level and the potential control line PL is set at the L level. The H level or L level potential of the first terminal Tr_D (indicated by oblique parallel lines in FIG. 1B) is supplied to the second terminal Tr_S. That is, in the backup period, in the case where the first terminal Tr_D has the H level potential, the H level potential is supplied to the second terminal Tr_S, and in the case where the first terminal Tr_D has the L level potential, the L level potential is supplied to the second terminal Tr_S. Note that the H level and the L level representing potentials of one wiring or terminal may be different from those of another wiring or terminal.

In the power-off period shown in FIG. 1B, the potential of the gate terminal Tr_G is changed to an L level and the potential of the potential control line PL is switched from the L level to an H level. The first terminal Tr_D is fixed at the H level. The second terminal Tr_S is brought into an electrically floating state; thus, in accordance with the change in potential of the potential control line PL, the H level or L level potential written in the backup period is relatively increased. In other words, the H level potential or the L level potential of the second terminal Tr_S can be increased to a potential H+ΔV or a potential L+ΔV.

The stop of the supply of the power supply voltage means the stop of the supply of at least one of the high power supply potential and the low power supply potential to the volatile memory circuit. For example, in the case where only the high power supply potential is supplied and the supply of the low power supply potential is stopped, the supply of the power supply voltage is stopped.

The supply of the power supply potential can be stopped by turning off a switch provided between a wiring that supplies the power supply potential and a node to which the power supply potential is to be supplied in the volatile memory circuit. Alternatively, the supply may be stopped by making the output of a power supply circuit high impedance.

To stop the supply of the power supply voltage in the power-off period in FIG. 1B, the potential of the wiring that supplies the low power supply potential may be set to the high power supply potential. In this case, it is preferable that a power switch provided for the wiring that supplies the low power supply potential be turned off and the potential of the node electrically disconnected from the wiring that supplies the low power supply potential be set to the high power supply potential. Then, only by turning off the power switch, the potential of the node electrically disconnected from the wiring that supplies the low power supply potential is increased and becomes equal to the high power supply potential, so that the supply of the power supply voltage can be stopped.

In the power-off period, the potentials of both the wirings that supply the power supply potentials are set to the high power supply potential, whereby each node of the volatile memory circuit is set at the H level potential; consequently, the first terminal Tr_D can be fixed at the H level.

The H level potential and the L level potential of the gate terminal Tr_G in FIG. 1B are VDD and GND, respectively. In one embodiment of the present invention, the H level and L level potentials of the gate terminal Tr_G each may be a potential in the range from GND to VDD. When each of the H level and L level potentials of the gate terminal Tr_G is set to the same potential as a potential supplied to the power supply line or set to a potential between the H level and L level potentials, an additional power supply circuit for generating a negative potential or a potential higher than VDD does not need to be provided, which can suppress increases in circuit area and power consumption. Note that one embodiment of the present invention is not limited to this example, and the H level potential of the gate terminal Tr_G may be a potential (VH) higher than VDD. Then, the semiconductor device can operate more stably.

Note that the H level potential and the L level potential of each of the first terminal Tr_D, the second terminal Tr_S, and the potential control line PL in FIG. 1B are also VDD and GND, respectively. In one embodiment of the present invention, the H level and L level potentials of the first terminal Tr_D, the second terminal Tr_S, and the potential control line PL each may be a potential in the range from GND to VDD, for example. When each of the H level and L level potentials of the gate terminal Tr_G is set to the same potential as a potential supplied to the power supply line or set to a potential between the H level and L level potentials, an additional power supply circuit for generating a negative potential or a potential higher than VDD does not need to be provided, which can suppress increases in circuit area and power consumption. Note that one embodiment of the present invention is not limited to this example. For example, the H level and the L level of the potential control line PL may be any potential as long as the H level is higher than the L level, and may be different from the potential levels of another signal. For example, the potential difference between the H level and the L level of the potential control line PL may be different from that of another signal. For example, the potential difference between the H level and the L level of the potential control line PL may be smaller than that of another signal, in which case power consumption can be reduced.

According to FIG. 1B, for the transistor Tr used for retaining data for a long time, when the potential of the gate terminal Tr_G is set high and the potential of the second terminal Tr_S is set low in the backup period, a voltage between the gate and the source (Vgs) can be higher than 0 V. When the potential of the gate terminal Tr_G is set low and the potentials of the first terminal Tr_D and the second terminal Tr_S are increased in the power-off period, Vgs can be lower than 0 V.

In that case, in the power-off period, Vgs can be a negative voltage even when the L level potential of the gate terminal Tr_G is GND. Thus, even when the transistor Tr is not a normally-off transistor, its off-state current can be kept small for a long time, whereby data can be retained at the second terminal Tr_S for a long time.

Furthermore, according to FIG. 1B, Vgs can be a negative voltage without supplying a negative potential lower than the L level to the gate terminal Tr_G. Thus, an additional power supply circuit for generating a negative potential does not need to be provided, which can reduce an off-state current in the power-off period. Moreover, increases in circuit area and power consumption due to a power supply circuit can be suppressed.

According to FIG. 1B, Vgs can be lowered even when the transistor Tr is not a normally-off transistor; thus, data can be retained at the second terminal Tr_S for a long time. In this embodiment, even when the transistor Tr is a normally-on transistor, countermeasures (such as shifting the threshold voltage in the positive direction with the use of a back gate) are not required.

According to FIG. 1B, a normally-on transistor can be used as the transistor Tr; thus, when the gate terminal Tr_G is at the H level, the on-state current can be increased. This can shorten the data backup period.

According to FIG. 1B, a reduction in on-state current due to a reduction in Vgs can be suppressed; thus, the H level potential of the gate terminal Tr_G can be reduced. Consequently, even when the potential of the gate terminal Tr_G is VH that is higher than VDD, the circuit area and power consumption of the power supply circuit can be reduced. Note that in the case where VH is equal to VDD, VH does not need to be generated; thus, the circuit area and power consumption of the power supply circuit can be further reduced.

In the power-off period, when the potential of the potential control line PL is switched from the L level to the H level, the H level potential and the L level potential of the second terminal Tr_S are increased to the potential H+ΔV and the potential L+ΔV, respectively. In order to increase ΔV, for example, it is preferable to increase the capacitance of the capacitor Cp, to reduce parasitic capacitance of the transistor Tr (parasitic capacitance between the gate and the source), and to reduce the channel length L, the channel width W, or the like of the transistor Tr. Thus, as an example, the capacitance of the capacitor Cp is preferably larger than that of a gate capacitance in the channel region of the transistor Tr (capacitance formed by a gate electrode, a gate insulating film, and a semiconductor layer (a channel region)). As a more preferable example, the capacitance of the capacitor Cp is larger than or equal to twice the gate capacitance in the channel region of the transistor Tr. As another example, the area of the electrodes included in the capacitor Cp is preferably larger than the area of the channel region of the transistor Tr. As a more preferable example, the area of the electrodes included in the capacitor Cp is preferably larger than or equal to twice the area of the channel region of the transistor Tr.

Next, specific examples of the circuit configuration of the semiconductor device are described with reference to FIGS. 2A and 2B, FIG. 3, FIGS. 4A and 4B, FIG. 5, FIGS. 11A and 11B, and FIG. 12.

Figure 2A:
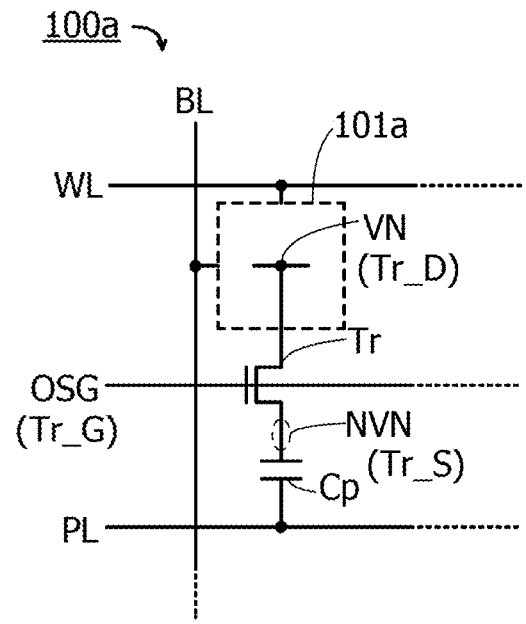
FIGS. 2A and 2B are circuit diagrams each illustrating one embodiment of the present invention.

FIG. 2A illustrates an example of a circuit configuration in which a potential of a node VN corresponding to data retained in a volatile memory circuit 101a is supplied through the transistor Tr and retained at a node NVN. The first terminal Tr_D and the second terminal Tr_S in FIG. 1A correspond to the node VN and the node NVN, respectively.

A semiconductor device 100a in FIG. 2A includes the volatile memory circuit 101a, the transistor Tr, and the capacitor Cp.

The semiconductor device 100a in FIG. 2A includes a word line WL and a bit line BL for controlling writing and reading of data to and from the volatile memory circuit 101a. In addition, the semiconductor device 100a in FIG. 2A includes the potential control line PL for controlling writing of data of the node VN to the node NVN between the transistor Tr and the capacitor Cp, retention of the data at the node NVN, and reading of the data from the node NVN, and a data control line OSG corresponding to the gate terminal Tr_G in FIG. 1A.

The volatile memory circuit 101a is a circuit that can input, output, and retain data in a period during which the power supply voltage is supplied; for example, an SRAM can be used.

Figure 11A:
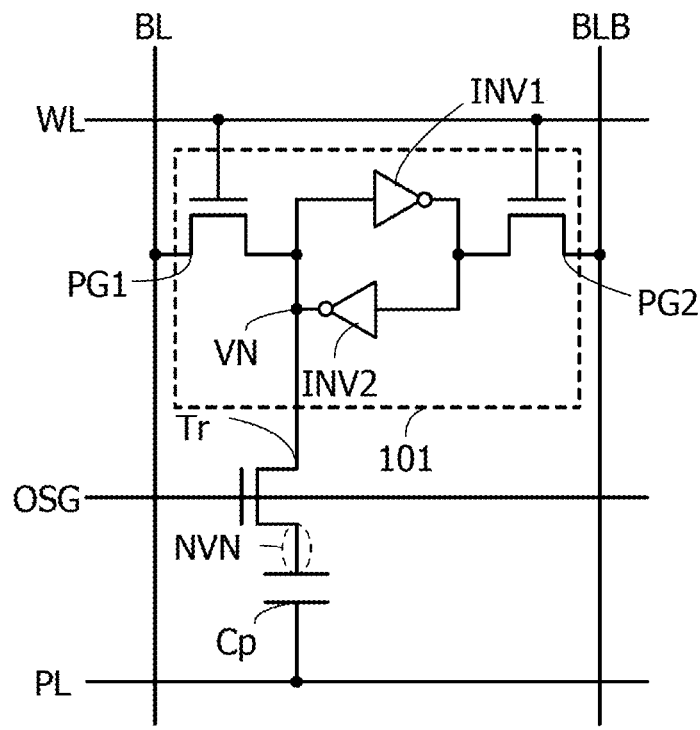
FIGS. 11A and 11B are circuit diagrams each illustrating one embodiment of the present invention.

FIG. 11A illustrates an example of a circuit configuration of a semiconductor device in which an SRAM is used as the volatile memory circuit 101a. A volatile memory circuit 101 serving as an SRAM in FIG. 11A includes a transistor PG1, a transistor PG2, an inverter INV1, and an inverter INV2. The volatile memory circuit 101 in FIG. 11A is connected to a bit line BL, an inverted bit line BLB, and a word line WL, and data writing and reading are controlled. The transistor Tr, the node NVN, the data control line OSG, the capacitor Cp, and the potential control line PL for retaining data of the node VN included in the volatile memory circuit 101 are the same as those in FIG. 2A.

Figure 11B:
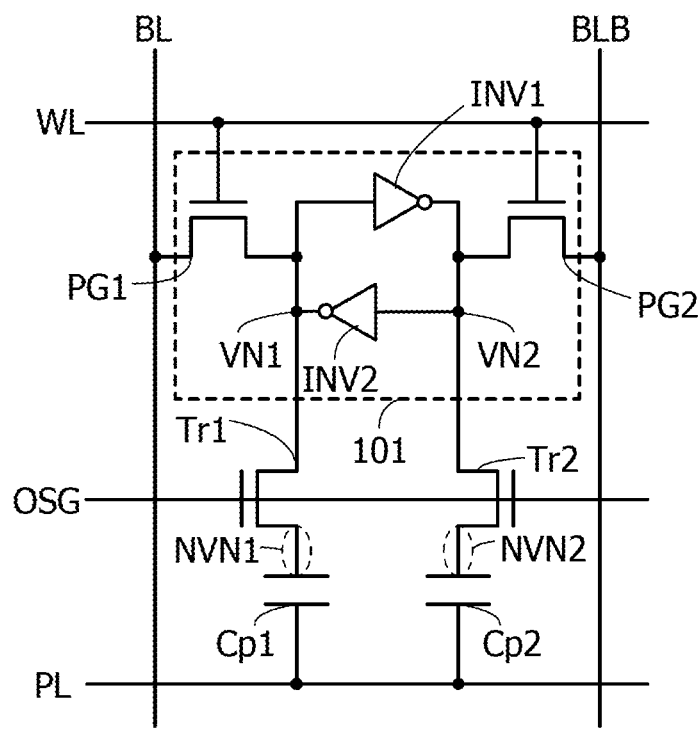

In the case where data at two nodes, a node VN1 and a node VN2, included in the volatile memory circuit 101 are retained in FIG. 11A, a transistor Tr1, a transistor Tr2, a node NVN1, a node NVN2, the data control line OSG, a capacitor Cp1, a capacitor Cp2, and the potential control line PL may be provided as illustrated in FIG. 11B.

In the semiconductor device 100a, the H level or L level potential corresponding to data '1' or '0' retained in the volatile memory circuit 101 is written to and retained at the node NVN. In the semiconductor device 100a, when the transistor Tr is turned on, the H level or L level potential of the node VN is written to the node NVN, and when the transistor Tr is turned off, the H level or L level potential is retained. The potential of each terminal of the transistor at the time the potential is written to and retained at the node NVN can be the same as that in FIG. 1B.

Note that in FIGS. 11A and 11B, the transistors PG1 and PG2 and transistors included in the inverters INV1 and INV2 are preferably Si transistors. When the Si transistors, the OS transistor, and the capacitor are stacked, the size of the semiconductor device can be reduced.

In the case of the semiconductor device 100a according to FIG. 1B, in retaining data, which is the power-off period, Vgs can be a negative voltage even when the potential of the data control line OSG corresponding to the gate terminal Tr_G is GND. Thus, even when the transistor Tr is not a normally-off transistor, its off-state current can be kept small for a long time, whereby data at the node VN corresponding to the first terminal Tr_D can be retained at the node NVN corresponding to the second terminal Tr_S for a long time.

In the case of the semiconductor device 100a according to FIG. 1B, a normally-on transistor can be used as the transistor Tr; thus, when the gate terminal Tr_G is at the H level, the on-state current can be increased. This can shorten the data backup period.

Figure 2B:
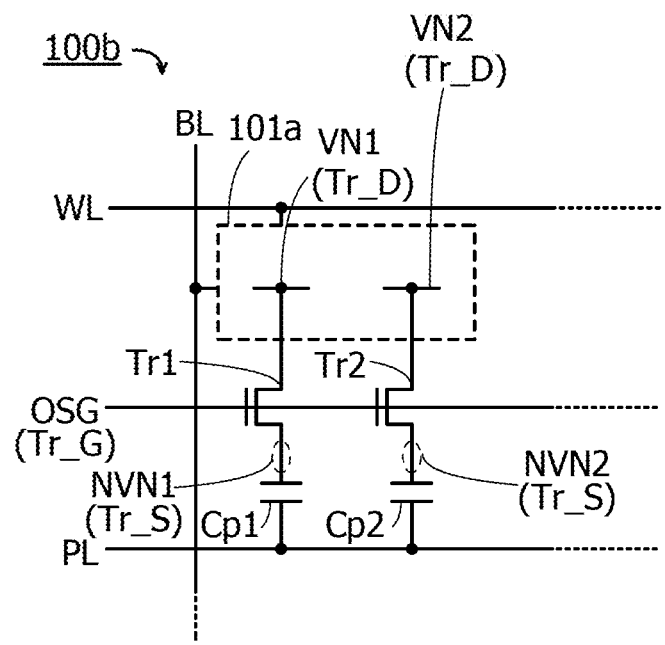

FIG. 2B illustrates an example of a circuit configuration of a semiconductor device 100b that includes a node VN1 and a node VN2 serving as the node VN in the volatile memory circuit 101a in FIG. 2A, a transistor Tr1 and a transistor Tr2 serving as the transistor Tr in FIG. 2A, a node NVN1 and a node NVN2 serving as the node NVN in FIG. 2A, and a capacitor Cp1 and a capacitor Cp2 serving as the capacitor Cp in FIG. 2A.

In the semiconductor device 100b in FIG. 2B, as in the semiconductor device 100a in FIG. 2A, without separately generating a negative potential to be supplied to the gates of the transistor Tr1 and the transistor Tr2, data can be retained for a long time and the on-state current can be increased.

Figure 3:
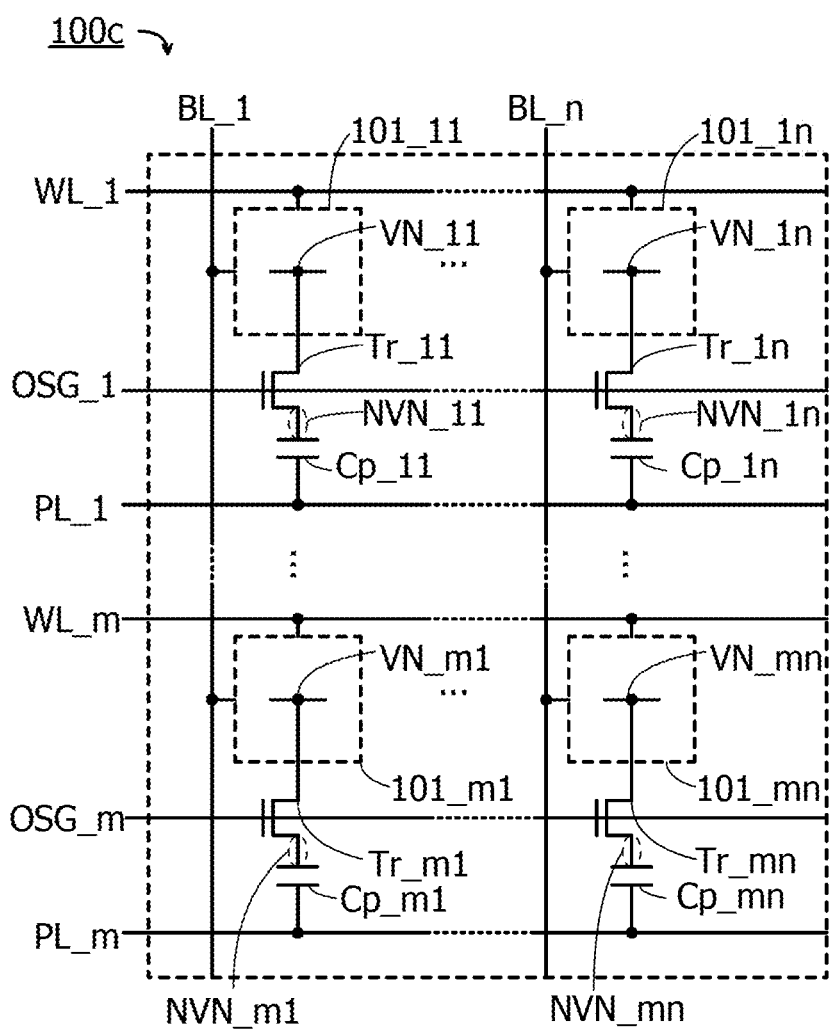
FIG. 3 is a circuit diagram illustrating one embodiment of the present invention.

FIG. 3 illustrates an example of a circuit configuration of a semiconductor device 100c in which the volatile memory circuits 101a in FIG. 2A are arranged in a matrix with m rows and n columns (m and n are each a natural number of 2 or more).

In the circuit configuration in FIG. 3, the volatile memory circuit 101a, the node VN, the transistor Tr, the node NVN, and the capacitor Cp in FIG. 2A correspond to volatile memory circuits 101_11 to 101_nm, nodes VN_11 to VN_nm, transistors Tr_11 to Tr_mn, nodes NVN_11 to NVN_nm, and capacitors Cp_11 to Cp_nm, respectively.

In the semiconductor device 100c in FIG. 3, as in the semiconductor device 100a in FIG. 2A, without separately generating negative potentials to be supplied to the gates of the transistors Tr_11 to Tr_mn, data can be retained for a long time and the on-state current can be increased.

Figure 4A:
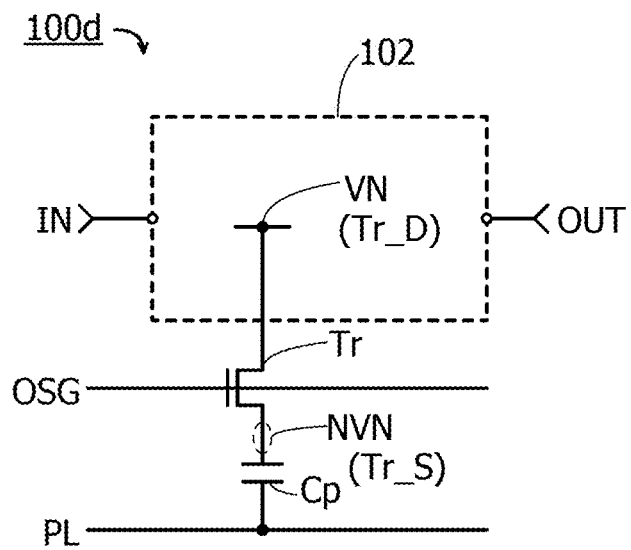
FIGS. 4A and 4B are circuit diagrams each illustrating one embodiment of the present invention.

FIG. 4A illustrates an example of a circuit configuration in which a potential of a node VN corresponding to data retained in a volatile memory circuit 102 is supplied through the transistor Tr and retained at a node NVN. The first terminal Tr_D and the second terminal Tr_S in FIG. 1A correspond to the node VN and the node NVN, respectively. The circuit configuration in FIG. 4A differs from that in FIG. 2A in that the volatile memory circuit 102 retains data input to an input terminal IN and outputs the data from an output terminal OUT.

A semiconductor device 100d in FIG. 4A includes the volatile memory circuit 102, the transistor Tr, and the capacitor Cp.

The semiconductor device 100d in FIG. 4A includes the input terminal IN and the output terminal OUT through which data is input to and output from the volatile memory circuit 102. In addition, the semiconductor device 100d in FIG. 4A includes the potential control line PL that controls writing of data at the node VN to the node NVN between the transistor Tr and the capacitor Cp, retention of the data at the node NVN, and reading of the data from the NVN, and a data control line OSG corresponding to the gate terminal Tr_G in FIG. 1A.

The volatile memory circuit 102 is a circuit that can input, output, and retain data in accordance with a control signal such as a clock signal supplied from the outside in a period during which the power supply voltage is supplied; for example, a flip-flop or the like can be used.

Figure 12:
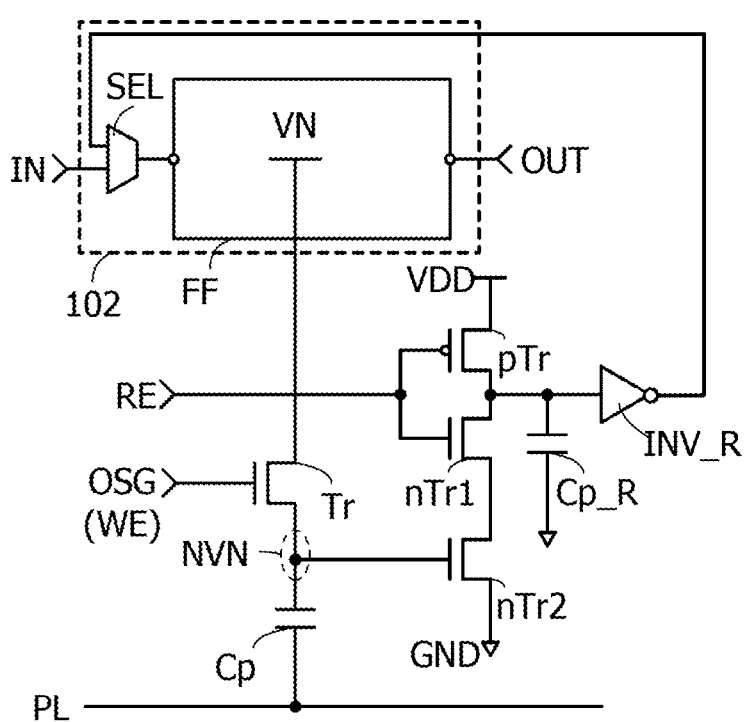
FIG. 12 is a circuit diagram illustrating one embodiment of the present invention.

FIG. 12 shows an example of a circuit configuration of a semiconductor device 100FF in which a flip-flop is used as the volatile memory circuit 102. The volatile memory circuit 102 serving as a flip-flop in FIG. 12 includes a selector SEL for selecting a terminal to which data is input and a flip-flop FF. The semiconductor device 100FF in FIG. 12 includes, in addition to the volatile memory circuit 102, the transistor Tr, the node NVN, the data control line OSG, the capacitor Cp, and the potential control line PL for retaining data of the node VN included in the volatile memory circuit 102, and their operations are the same as those in FIG. 2A. Furthermore, the semiconductor device 100FF in FIG. 12 includes a wiring to which a reading control signal RE is supplied, a transistor pTr, a transistor nTr1, a transistor nTr2, a capacitor Cp_R, and an inverter INV_R for reading data retained at the node NVN and inputting the data to the volatile memory circuit 102 through the selector SEL.

In the semiconductor device 100FF in FIG. 12, reading of data retained at the node NVN is based on whether the transistor nTr2 is turned on or off depending on the potential retained at the node NVN. When the reading control signal RE is set at the L level, charge stored in the capacitor Cp_R through the transistor pTr is released through the transistors nTr1 and nTr2 by switching the reading control signal RE to the H level. This release is controlled by whether the transistor nTr2 is turned on or off. Thus, a signal output from the inverter INV_R can be a signal corresponding to the data retained at the node NVN.

Note that in FIG. 12, the transistors pTr, nTr1, and nTr2 and transistors included in the inverter INV_R are preferably Si transistors. When the Si transistors, the OS transistor, and the capacitor are stacked, the size of the semiconductor device can be reduced.

In the semiconductor device 100d, the H level or L level potential corresponding to data '1' or '0' retained in the volatile memory circuit 102 is written to and retained at the node NVN. In the semiconductor device 100d, when the transistor Tr is turned on, the H level or L level potential of the node VN is written to the node NVN, and when the transistor Tr is turned off, the H level or L level potential is retained. The potential of each terminal of the transistor at the time the potential is written to and retained at the node NVN can be the same as that in FIG. 1B.

In the case of the semiconductor device 100d according to FIG. 1B, in retaining data, which is the power-off period, Vgs can be a negative voltage even when the potential of the data control line OSG corresponding to the gate terminal Tr_G is GND. Thus, even when the transistor Tr is not a normally-off transistor, its off-state current can be kept small for a long time, whereby data at the node VN corresponding to the first terminal Tr_D can be retained at the node NVN corresponding to the second terminal Tr_S for a long time.

In the case of the semiconductor device 100d according to FIG. 1B, a normally-on transistor can be used as the transistor Tr; thus, when the gate terminal Tr_G is at the H level, the on-state current can be increased. This can shorten the data backup period.

Figure 4B:
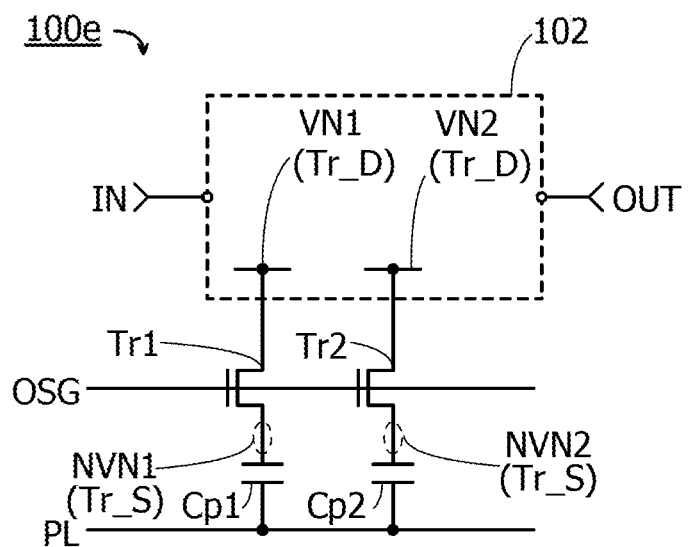

FIG. 4B illustrates an example of a circuit configuration of a semiconductor device 100e that includes a node VN1 and a node VN2 serving as the node VN in the volatile memory circuit 102 in FIG. 4A, a transistor Tr1 and a transistor Tr2 serving as the transistor Tr in FIG. 4A, a node NVN1 and a node NVN2 serving as the node NVN in FIG. 4A, and a capacitor Cp1 and a capacitor Cp2 serving as the capacitor Cp in FIG. 4A.

In the semiconductor device 100e in FIG. 4B, as in the semiconductor device 100d in FIG. 4A, without separately generating a negative potential to be supplied to the gates of the transistor Tr1 and the transistor Tr2, data can be retained for a long time and the on-state current can be increased.

Figure 5:
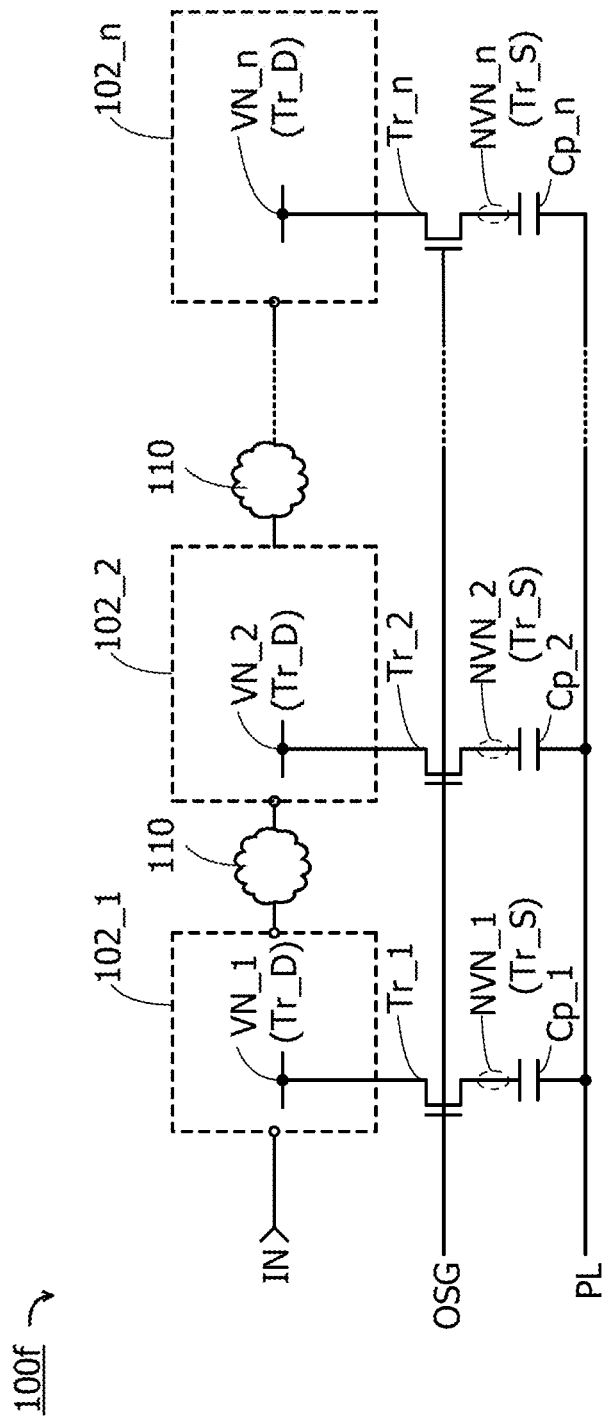
FIG. 5 is a circuit diagram illustrating one embodiment of the present invention.

FIG. 5 illustrates an example of a circuit configuration of a semiconductor device 100f in which n volatile memory circuits 102 in FIG. 4A are arranged (n is a natural number of 2 or more).

In the circuit configuration in FIG. 5, the volatile memory circuit 102, the node VN, the transistor Tr, the node NVN, and the capacitor Cp in FIG. 4A correspond to volatile memory circuits 102_1 to 102_n, nodes VN_1 to VN_n, transistors Tr_1 to Tr_n, nodes NVN_1 to NVN_n, and capacitors Cp_1 to Cp_n, respectively. In FIG. 5, logic circuits or combinational circuits are preferably provided between the volatile memory circuits 102_1 to 102_n and are illustrated as circuits 110.

In the semiconductor device 100f in FIG. 5, as in the semiconductor device 100d in FIG. 4A, without separately generating a negative potential to be supplied to the gates of the transistors Tr_1 to Tr_n, data can be retained for a long time and the on-state current can be increased.

Figure 6A:
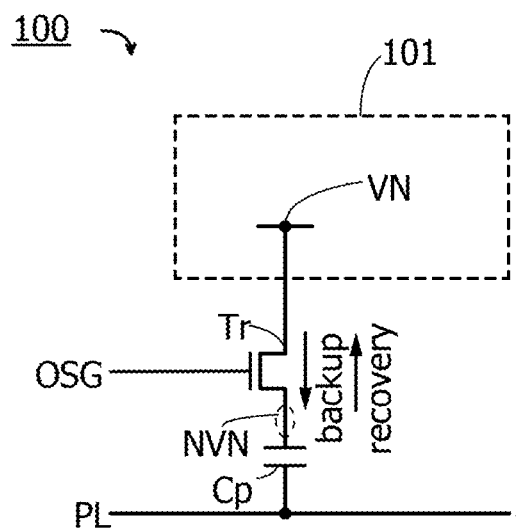
FIGS. 6A and 6B are a circuit diagram and a timing chart illustrating one embodiment of the present invention.

FIG. 6A is a partial circuit diagram of any of the circuit configurations illustrated in FIGS. 2A and 2B, FIG. 3, FIGS. 4A and 4B, and FIG. 5 for explaining the operation of the semiconductor device of one embodiment of the present invention. A semiconductor device 100 in FIG. 6A includes the volatile memory circuit 101, the transistor Tr, the node VN, the node NVN, the data control line OSG, the capacitor Cp, and the potential control line PL.

In FIG. 6A, operation of data backup from the node VN to the node NVN through the transistor Tr in the backup period is visualized using an arrow. In addition, in FIG. 6A, operation of data recovery from the node NVN to the node VN through the transistor Tr in a recovery period is visualized using an arrow.

Figure 6B:
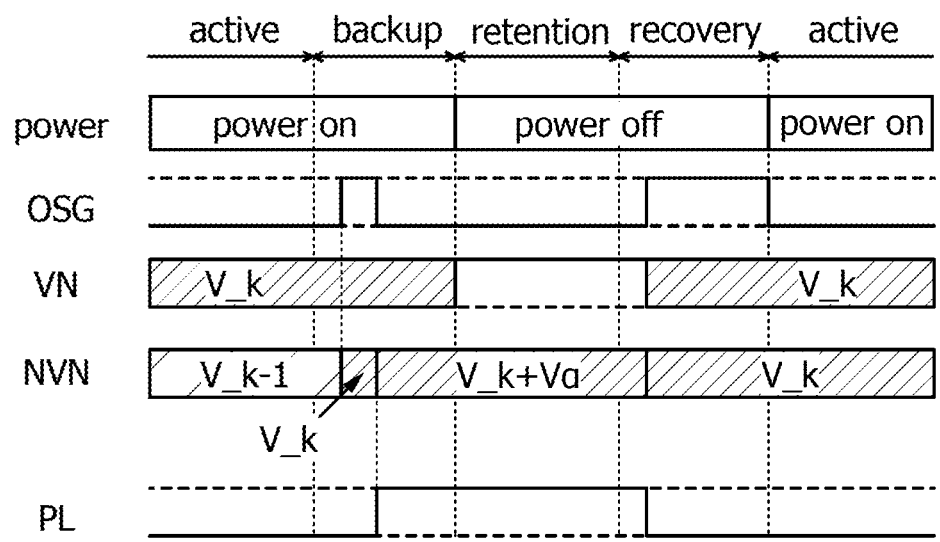

FIG. 6B is a timing chart of the supply or stop of a power supply voltage, a signal for the data control line OSG, signals retained at the nodes VN and NVN, and a signal for the potential control line PL in an active period, a backup period, a retention period, and a recovery period.

In FIG. 6B, the supply of a power supply voltage which is denoted by "power" is shown as "power on" in a period during which the power supply voltage is supplied to the semiconductor device, and is shown as "power off" in a period during which the supply of the power supply voltage to the semiconductor device is stopped. Note that the supply of the power supply voltage to the semiconductor device can be stopped by stopping the supply of the low power supply potential.

In FIG. 6B, a potential which is denoted by V_k (k is a natural number of 2 or more) and corresponds to k-th data is a potential supplied in a given period. A potential V_k−1 is a given potential supplied in a period before the supply of V_k. A potential V_k+Vα is a potential which is increased from the potential V_k corresponding to the k-th data in accordance with an increase in the potential of the potential control line PL. Note that the potential V_k−1 may be changed by storage or release of charge in the case where the potential is not rewritten in the power-on period.

In the timing chart in FIG. 6B, in the first active period, the power supply voltage is supplied; the data control line OSG is at an L level; the node VN is at the potential V_k; the node NVN is at the potential V_k−1; and the potential control line PL is at an L level. In the active period, the transistor Tr is off, and the potential of the node NVN hardly affects the node VN. Therefore, in that period, data is written or read at high speed to or from the volatile memory circuit 101 to which the power supply voltage is supplied.

Next, in the backup period, the power supply voltage is supplied, and the potential V_k−1 of the node NVN is rewritten with the potential V_k of the node VN at the timing of switching of the potential of the data control line OSG from the L level to an H level. After the potential of the node NVN is rewritten with the potential V_k, the potential of the data control line OSG is changed from the H level to the L level. In addition, the potential of the potential control line PL is switched from the L level to an H level. Then, the potential V_k of the node NVN is increased to the potential V_k+Vα.

Next, in the retention period, the supply of the power supply voltage is stopped, and the data control line OSG is set at the L level. At that time, when a switch provided for a wiring for the low power supply potential is turned off and the potential of the wiring to which the low power supply potential has been supplied is increased to VDD because of leakage current flowing in the volatile memory circuit 101, the potential of wirings of the power supply line can be made equal to VDD and thus the supply of the power supply voltage is stopped. Accordingly, the node VN is set at the H level potential that is the potential of the power supply line. As the potential of the node NVN, the potential V_k+Vα set in the backup period is retained when the potential control line PL is held at the H level and the data control line OSG is held at the L level.

In one embodiment of the present invention, the potential of a node corresponding to a source or a drain of the transistor Tr is increased in the retention period. Accordingly, Vgs can be a negative voltage even when the L level potential of the data control line OSG is GND. Thus, even when the transistor Tr is not a normally-off transistor, its off-state current can be kept small for a long time, whereby data at the node VN can be retained at the node NVN for a long time.

Next, in the recovery period, the supply of the power supply voltage is stopped; the potential of the potential control line PL is switched from the H level to the L level; and the potential V_k+Vα of the node NVN is returned to the potential V_k. In addition, the potential of the data control line OSG is switched from the L level to the H level, and charge is shared by the node VN and the node NVN. Then, the potential of the node NVN changes in accordance with the potential V_k. In this state, the supply of the power supply voltage is restarted, and the potential of the node NVN is returned to the potential V_k. In addition, the potential of the data control line OSG is changed from the H level to the L level. Then, the operation returns to the active period.

In one embodiment of the present invention, Vgs of the transistor Tr in an off state can be a negative voltage;

therefore, it is not necessary to use a normally-off transistor whose threshold voltage is adjusted in advance using a back gate voltage or the like. Thus, a normally-off transistor does not need to be used as the transistor Tr, and a normally-on transistor can be used. With the use of a normally-on transistor as the transistor Tr, the on-state current of the transistor can be increased. This can shorten the data backup period.

Figure 7A:
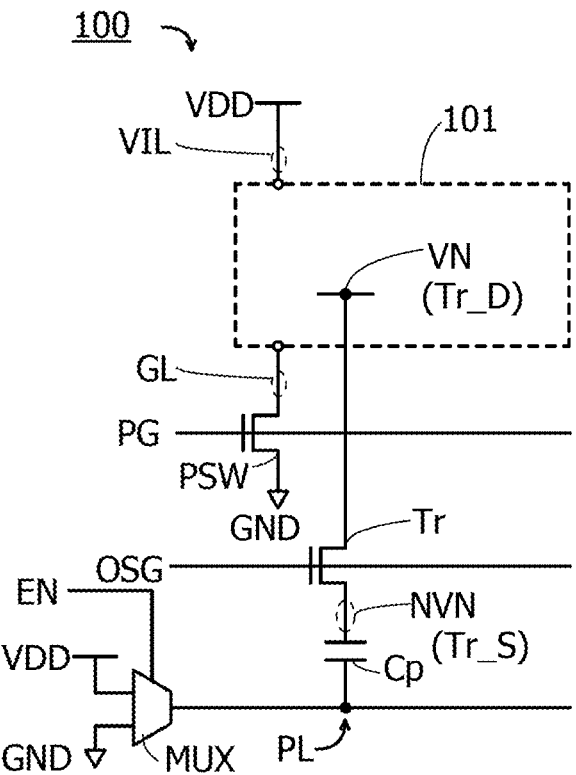
FIGS. 7A and 7B are a circuit diagram and a timing chart illustrating one embodiment of the present invention.
Figure 7B:
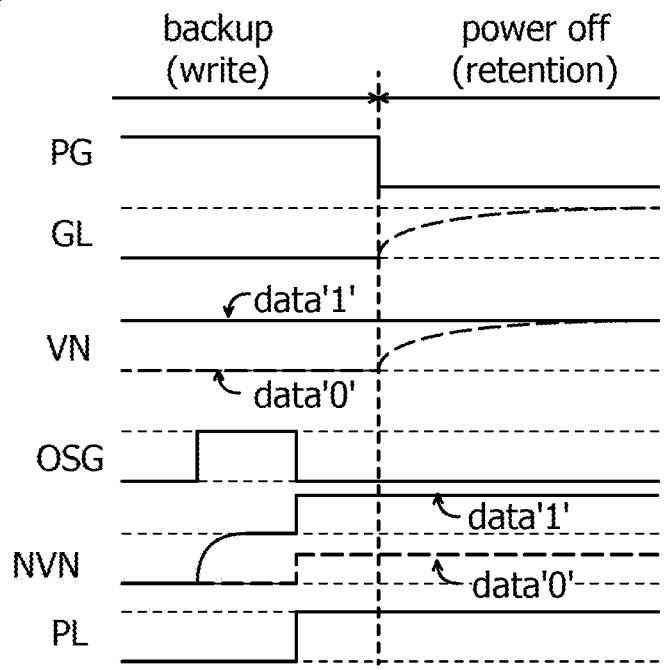
Figure 8:
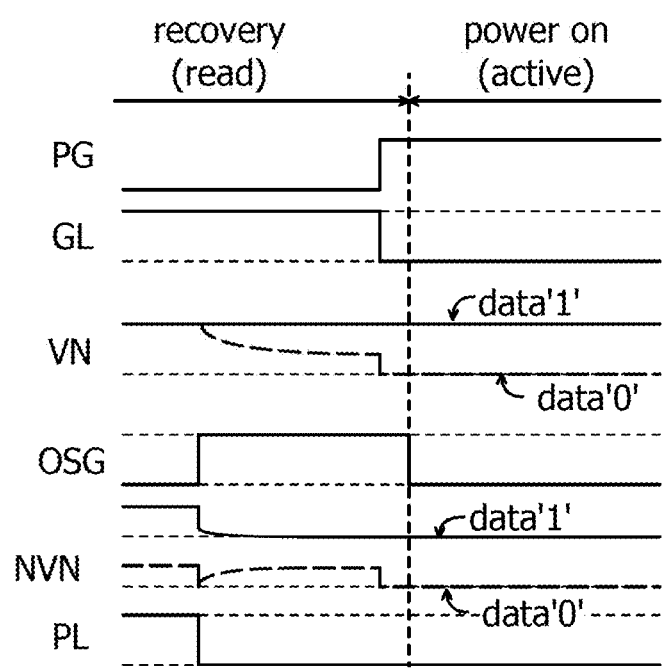
FIG. 8 is a timing chart illustrating one embodiment of the present invention.

FIG. 7A is a circuit diagram of the semiconductor device 100 including a power switch PSW for stopping the supply of the power supply voltage to the volatile memory circuit 101. FIG. 7B is a timing chart illustrating operations, including an operation of turning on or off the power switch PSW in FIG. 7A, in a backup period and a retention period. FIG. 8 is a timing chart illustrating operations, including the operation of turning on or off the power switch PSW in FIG. 7A, in a recovery period and an active period. FIGS. 7B and 8 illustrate details of a power-gating operation for stopping and restarting the supply of the power supply voltage.

The semiconductor device 100 in FIG. 7A includes the volatile memory circuit 101, the power switch PSW, a power control line PG, the transistor Tr, a node VIL, a node GL, the node VN, the node NVN, the data control line OSG, the capacitor Cp, the potential control line PL, a selection circuit MUX, and a potential selection line EN.

In the semiconductor device 100 in FIG. 7A, the power switch PSW is provided between a wiring that supplies GND and the node GL. Accordingly, when the power switch PSW is turned off, the potential of the node GL can be increased from GND to VDD eventually. Thus, the node VN can be set at VDD.

Note that when the power switch PSW is turned off, the potential of the node GL can be increased from GND to VDD eventually. This is because of leakage current of the volatile memory circuit 101. More precisely, there is a small leakage current of the power switch PSW, and therefore, the node GL does not become exactly VDD but becomes a potential around VDD.

When the power switch PSW is turned on, the potential of the node GL becomes GND. More precisely, owing to the on-state resistance of the power switch PSW and the leakage current of the volatile memory circuit 101, the node GL does not become exactly GND but becomes a potential around GND.

In the semiconductor device 100 in FIG. 7A, the potential supplied to the potential control line PL is switched between VDD and GND in accordance with a control signal supplied to the selection circuit MUX through the potential selection line EN. The potential is switched by the selection circuit MUX between VDD and GND. In that case, the same potential can be supplied to the volatile memory circuit 101 as a power supply voltage; thus, another potential does not need to be generated and supplied to the potential control line PL. Therefore, an additional power supply circuit does not need to be provided, which can suppress increases in circuit area and power consumption.

FIG. 7B is a timing chart for the power control line PG, the node GL, the node VN, the data control line OSG, the node NVN, and the potential control line PL in the backup period and the retention period. Note that in FIG. 7B, data '1' and data '0' are shown for explanation, and potential changes are indicated by solid and dashed lines.

In the backup period in FIG. 7B, the power control line PG is set at an H level and the power switch PSW is turned on to supply a power supply voltage. At this time, the node GL is at GND. In addition, the node VN is at an H level for data '1' or at an L level for data '0'. The potential of the node NVN changes in accordance with the potential of the node VN at the timing of switching of the potential of the data control line OSG from an L level to an H level. After the potential of the node NVN is changed in accordance with the potential of the node VN, the potential of the data control line OSG is changed from the H level to the L level, whereby the node NVN is brought into an electrically floating state. In addition, the potential of the potential control line PL is changed from an L level to an H level. Then, the node NVN is set at a potential which is further increased from the H level or L level potential.

Note that in the backup period in FIG. 7B, the timing of switching of the potential of the potential control line PL from the L level to the H level is preferably after the switching of the potential of the data control line OSG from the H level to the L level. This is because, when the potential of the data control line OSG is changed from the H level to the L level, charge accumulated in the capacitor Cp is confined at the node NVN and data is fixed.

Note that the frequency of switching of the potential of the potential control line PL from the L level to the H level and the frequency of switching of the potential of the data control line OSG from the H level to the L level are preferably low such that data is not affected by release of charge accumulated in the capacitor Cp through the transistor Tr. In this regard, the switching of the potential of the potential control line PL from the L level to the H level and the switching of the potential of the data control line OSG from the H level to the L level may be performed at the same time.

Next, in the retention period in FIG. 7B, the power control line PG is set at an L level and the power switch PSW is turned off to stop the supply of the power supply voltage. In that case, the potential of the node GL is increased from GND to VDD. Data retained at the node VN is lost, and the potential of the node VN becomes the H level regardless of data in the previous period. By holding the data control line OSG at the L level, the node NVN can be held at the potential which is increased from the potential in the backup period. The potential control line PL is held at the H level.

Next, in the recovery period in FIG. 8, the potential of the potential control line PL is switched from the H level to the L level to recover data. Then, the potential of the node NVN is decreased from the increased potential in the backup period to the original potential of the data '1' or '0'. In addition, the potential of the data control line OSG is switched from the L level to the H level, and the potential of the node VN is changed in accordance with the potential of the node NVN. When the data retained at the node NVN is the data '1', the potential of the node VN does not change, and when the data retained at the node NVN is the data '0', the potential of the node VN is decreased. In addition, the power control line PG is set at the H level and the power switch PSW is turned on, whereby the supply of the power supply voltage is restarted. Then, the potential of the node VN can be set to the H level or the L level in accordance with the level of the potential corresponding to the data. In addition, the potential of the data control line OSG is switched from the H level to the L level. Then, the operation returns to the active period.

Figure 9A:
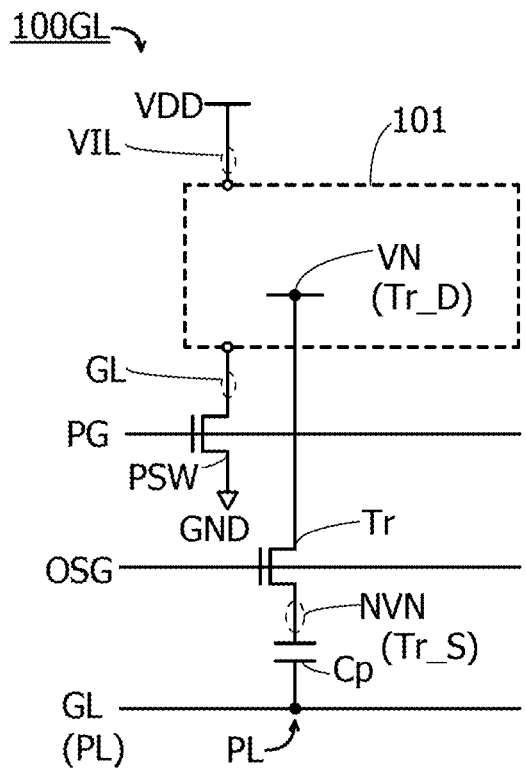
FIGS. 9A and 9B are a circuit diagram and a timing chart illustrating one embodiment of the present invention.
Figure 9B:
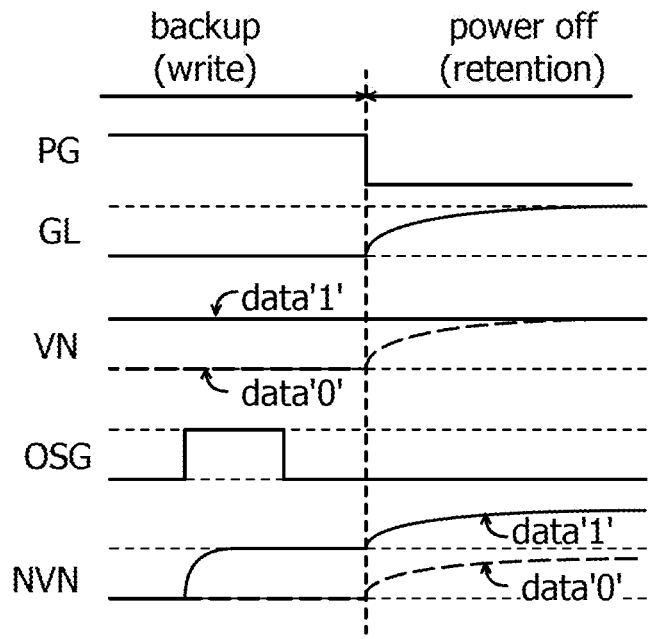

FIG. 9A is a circuit diagram of a semiconductor device 100GL which differs from the semiconductor device 100 in FIG. 7A and includes a power switch PSW for restarting the supply of a power supply voltage to the volatile memory circuit 101. FIG. 9B is a timing chart illustrating operations, including an operation of turning on or off the power switch PSW in FIG. 9A, in a backup period and a retention period.

Figure 10:
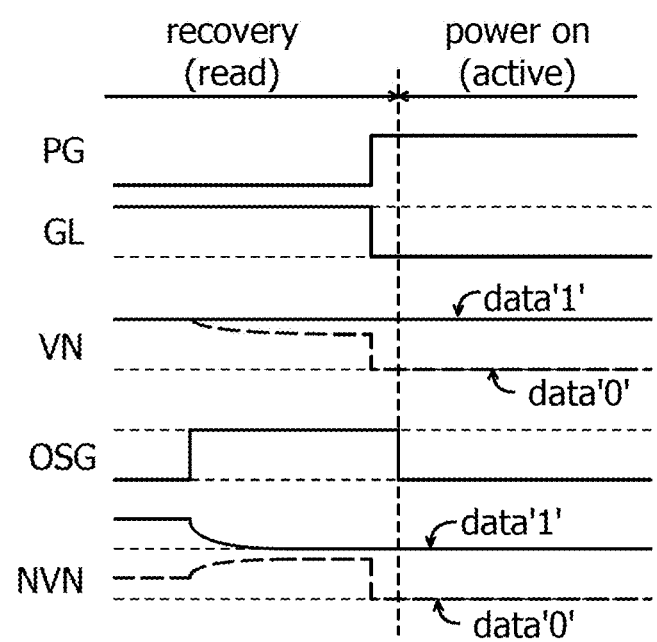
FIG. 10 is a timing chart illustrating one embodiment of the present invention.

FIG. 10 is a timing chart illustrating operations, including the operation of turning on or off the power switch PSW in FIG. 9A, in a recovery period and an active period. FIGS. 9B and 10 illustrate details of operations for stopping and restarting the supply of a power supply voltage.

The semiconductor device 100GL in FIG. 9A includes the volatile memory circuit 101, the power switch PSW, a power control line PG, the transistor Tr, a node VIL, a node GL, the node VN, the node NVN, the data control line OSG, and the capacitor Cp. Note that the semiconductor device 100GL in FIG. 9A differs from the semiconductor device 100 in FIG. 7A in using the potential of the node GL as that of the power control line PL.

The configuration in FIG. 9A makes it possible to eliminate the selection circuit MUX for controlling the potential of the potential control line PL and the potential selection line EN for controlling the selection circuit MUX. Therefore, the power consumption and size of the semiconductor device can be reduced.

In the semiconductor device 100GL in FIG. 9A, a ground line which supplies GND is provided with the power switch PSW. Accordingly, when the power switch PSW is turned off, the potential of the node GL can be increased from GND to VDD eventually. Thus, the node VN can be set at VDD.

In the semiconductor device 100GL in FIG. 9A, a potential supplied to the potential control line PL is set equal to that of the node GL. Accordingly, after the supply of the power supply voltage is stopped, the potential of the node GL is changed from GND to VDD. In that case, although the potential of the node NVN is not increased in the backup period, the potential of the node NVN can be increased in the retention period.

FIG. 9B is a timing chart for the power control line PG, the node GL, the node VN, the data control line OSG, and the node NVN in the backup period and the retention period. Note that in FIG. 9B, data '1' and data '0' are shown for explanation, and potential changes are indicated by solid and dashed lines.

In the backup period in FIG. 9B, the power control line PG is set at an H level and the power switch PSW is turned on to supply a power supply voltage. In that case, the node GL is at GND. In addition, the node VN is at an H level for data '1' or at an L level for data '0'. The potential of the node NVN changes in accordance with the potential of the node VN at the timing of switching of the potential of the data control line OSG from an L level to an H level. After the potential of the node NVN is changed in accordance with the potential of the node VN, the potential of the data control line OSG is changed from the H level to the L level.

Next, in the retention period in FIG. 9B, the power control line PG is set at an L level and the power switch PSW is turned off to stop the supply of the power supply voltage. In that case, the potential of the node GL is increased from GND to VDD. At this time, since the node NVN is in an electrically floating state, the node NVN is set at a potential which is further increased from the H level or L level potential as the potential of the node GL increases. Data retained at the node VN is lost, and the potential of the node VN becomes the H level regardless of data in the previous period. By holding the data control line OSG at the L level, the node NVN can be held at the potential which is increased from the potential in the backup period.

Next, in the recovery period in FIG. 10, the potential of the data control line OSG is switched from the L level to the H level, and the potential of the node VN is changed in accordance with the potential of the node NVN. When the data retained at the node NVN is the data '1', the potential of the node VN does not change, and when the data retained at the node NVN is the data '0', the potential of the node VN is decreased. In addition, the power control line PG is set at the H level and the power switch PSW is turned on, whereby the supply of the power supply voltage is restarted. Then, the potential of the node VN can be set to the H level or the L level in accordance with the level of the potential corresponding to the data. In addition, the potential of the data control line OSG is switched from the H level to the L level.

In the above-described embodiment of the present invention, the potential of a node corresponding to a source or a drain of the transistor Tr is increased in the retention period. Accordingly, Vgs can be a negative voltage even when the L level potential of the data control line OSG is GND. Thus, even when the transistor Tr is not a normally-off transistor, off-state current can be kept small for a long time, whereby data at the node VN can be retained at the node NVN for a long time.

In addition, in one embodiment of the present invention, Vgs of the transistor Tr in an off state can be a negative voltage; therefore, it is not necessary to use a normally-off transistor whose threshold voltage is adjusted in advance using a back gate voltage or the like. A normally-off transistor does not need to be used as the transistor Tr, and a normally-on transistor can be used. With the use of a normally-on transistor as the transistor Tr, the on-state current of the transistor can be increased. This can shorten the data backup and recovery periods.

The structure described above in this embodiment can be combined with any of the structures described in the other embodiments as appropriate.

Embodiment 2

This embodiment will explain an oxide semiconductor layer that can be used as a semiconductor layer of the transistor with low off-state current described in the foregoing embodiment.

An oxide semiconductor used for a channel formation region in the semiconductor layer of the transistor preferably contains at least indium (In) or zinc (Zn). In particular, the oxide semiconductor preferably contains both In and Zn. The oxide semiconductor preferably contains a stabilizer for strongly bonding oxygen, in addition to In and Zn. The oxide semiconductor preferably contains at least one of gallium (Ga), tin (Sn), zirconium (Zr), hafnium (Hf), and aluminum (Al) as the stabilizer.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide with an atomic ratio of In:Ga:Zn=1:1:1, 3:1:2, or 2:1:3 or an oxide with an atomic ratio close to the above atomic ratios can be used.

If an oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). For that reason, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film. Note that "substantially intrinsic" means that the oxide semiconductor film contains extremely few (close to zero) carriers derived from a donor and has a carrier density which is $1\times10^{17}/cm^3$ or lower, $1\times10^{16}/cm^3$ or lower, $1\times10^{15}/cm^3$ or lower, $1\times10^{14}/cm^3$ or lower, or $1\times10^{13}/cm^3$ or lower, particularly preferably lower than $8\times10^{11}/cm^3$, still further preferably lower than $1\times10^{11}/cm^3$, yet further preferably lower than $1\times10^{10}/cm^3$, and is $1\times10^{-9}/cm^3$ or higher.

The transistor including an i-type or substantially i-type oxide semiconductor film can have extremely favorable off-state current characteristics. For example, the off-state drain current of the transistor including the oxide semiconductor film can be $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C. Note that the off state of an n-channel transistor refers to a state where a gate voltage is sufficiently lower than the threshold voltage. Specifically, the transistor is off when the gate voltage is lower than the threshold voltage by 1 V or more, 2 V or more, or 3 V or more.

The oxide semiconductor film may include one or more of the following: an oxide semiconductor having a single crystal structure (hereinafter referred to as a single crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). Furthermore, the oxide semiconductor film may be formed using a CAAC-OS film. Furthermore, the oxide semiconductor film may include an amorphous oxide semiconductor and an oxide semiconductor having a crystal grain. Described below are the CAAC-OS and the microcrystalline oxide semiconductor.

First, a CAAC-OS film will be described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each layer of metal atoms has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

FIG. 13A is a cross-sectional TEM image of a CAAC-OS film. FIG. 13B is a cross-sectional TEM image obtained by enlarging the image of FIG. 13A. In FIG. 13B, atomic arrangement is highlighted for easy understanding.

FIG. 13C is local Fourier transform images of regions each surrounded by a circle (the diameter is about 4 nm) between A and O and between 0 and A' in FIG. 13A. C-axis alignment can be observed in each region in FIG. 13C. The c-axis direction between A and O is different from that between O and A', which indicates that a grain in the region between A and O is different from that between O and A'. In addition, the angle of the c-axis between A and O continuously and gradually changes, for example, 14.3°, 16.6°, and 26.4°. Similarly, the angle of the c-axis between 0 and A' continuously changes, for example, −18.3°, −17.6°, and −15.9°.

Note that in an electron diffraction pattern of the CAAC-OS film, spots (bright spots) indicating alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 14A).

From the results of the cross-sectional TEM image and the plan-view TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan-view TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray is incident on a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of InGaZnO$_4$, six peaks appear. The six peaks are derived from crystal planes equivalent to the (110) plane. On the other hand, in the case of a CAAC-OS film, a peak is not clearly observed even when θ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added may be altered and the proportion of the c-axis aligned crystal parts in the CAAC-OS film might vary depending on regions.

Note that when the CAAC-OS film with an InGaZnO$_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

In an image obtained with the TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In an image of the nc-OS film which is obtained with the TEM, for example, a grain boundary is not clearly detected in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Further, a halo pattern is shown in a selected-area electron diffraction pattern of the nc-OS film obtained by using an electron beam having a probe diameter (e.g., 50 nm or larger) larger than the size of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases (see FIG. 14B).

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where an oxide semiconductor film has a plurality of structures, the structures can be analyzed using nanobeam electron diffraction in some cases.

Figure 14A:
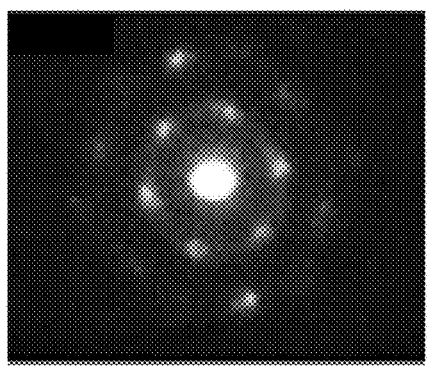
FIGS. 14A and 14B show nanobeam electron diffraction patterns of oxide semiconductor films.
Figure 14B:
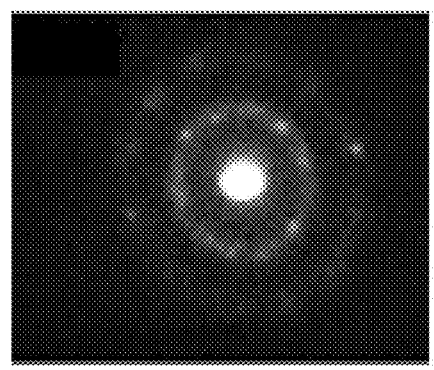
Figure 14C:
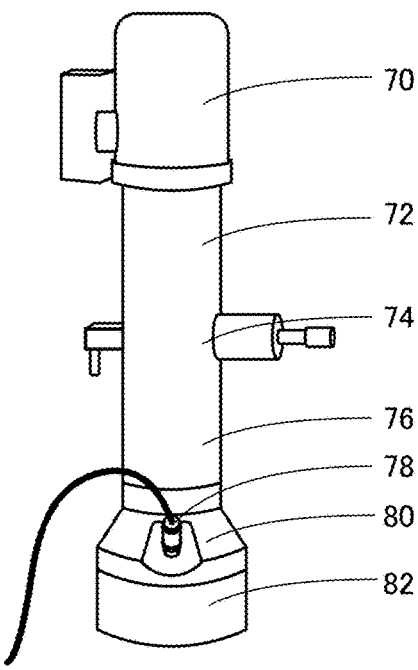
FIGS. 14C and 14D illustrate an example of a transmission electron diffraction measurement apparatus.

FIG. 14C illustrates a transmission electron diffraction measurement apparatus which includes an electron gun chamber 70, an optical system 72 below the electron gun chamber 70, a sample chamber 74 below the optical system 72, an optical system 76 below the sample chamber 74, an observation chamber 80 below the optical system 76, a camera 78 installed in the observation chamber 80, and a film chamber 82 below the observation chamber 80. The camera 78 is provided to face toward the inside of the observation chamber 80. Note that the film chamber 82 is not necessarily provided.

Figure 14D:
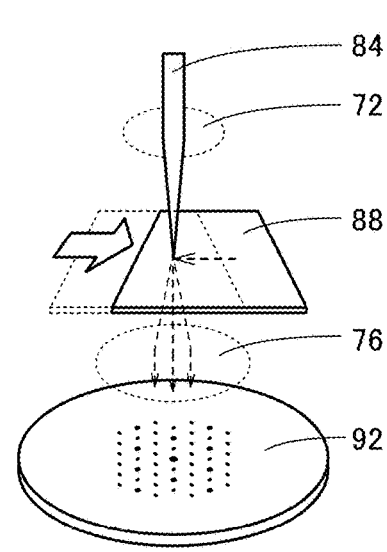

FIG. 14D illustrates an internal structure of the transmission electron diffraction measurement apparatus illustrated in FIG. 14C. In the transmission electron diffraction measurement apparatus, a substance 88 which is positioned in the sample chamber 74 is irradiated with electrons emitted from an electron gun installed in the electron gun chamber 70 through the optical system 72. Electrons passing through the substance 88 are incident on a fluorescent plate 92 provided in the observation chamber 80 through the optical system 76. On the fluorescent plate 92, a pattern corresponding to the intensity of the incident electrons appears, which allows measurement of a transmission electron diffraction pattern.

The camera 78 is installed so as to face the fluorescent plate 92 and can take an image of a pattern appearing on the fluorescent plate 92. An angle formed by a straight line which passes through the center of a lens of the camera 78 and the center of the fluorescent plate 92 and an upper surface of the fluorescent plate 92 is, for example, 15° or more and 80° or less, 30° or more and 75° or less, or 45° or more and 70° or less. As the angle is reduced, distortion of the transmission electron diffraction pattern taken by the camera 78 becomes larger. Note that if the angle is obtained in advance, the distortion of an obtained transmission electron diffraction pattern can be corrected. Note that the film chamber 82 may be provided with the camera 78. For example, the camera 78 may be set in the film chamber 82 so as to be opposite to the incident direction of electrons 84. In this case, a transmission electron diffraction pattern with less distortion can be taken from the rear surface of the fluorescent plate 92.

A holder for fixing the substance 88 that is a sample is provided in the sample chamber 74. The holder transmits electrons passing through the substance 88. The holder may have, for example, a function of moving the substance 88 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 µm. The range is preferably determined to be an optimal range for the structure of the substance 88.

Then, a method for measuring a transmission electron diffraction pattern of a substance by the transmission electron diffraction measurement apparatus described above will be described.

For example, changes in the structure of a substance can be observed by changing (scanning) the irradiation position of the electrons 84 that are a nanobeam on the substance, as illustrated in FIG. 14D. At this time, when the substance 88 is a CAAC-OS film, a diffraction pattern shown in FIG. 14A is observed. When the substance 88 is an nc-OS film, a diffraction pattern shown in FIG. 14B is observed.

Even when the substance 88 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high-quality CAAC-OS film, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 15A:
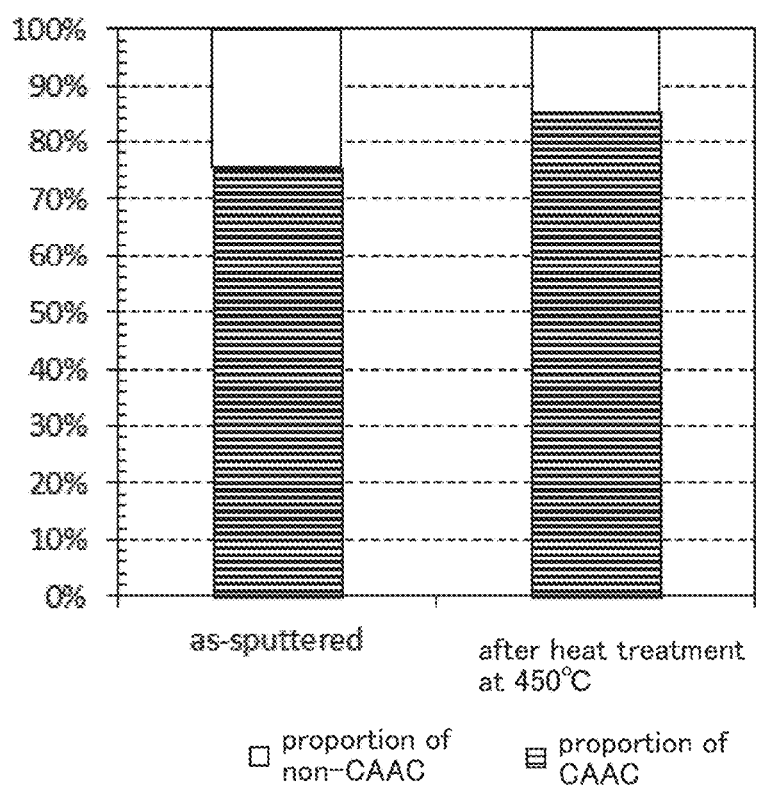
FIG. 15A shows an example of structural analysis by transmission electron diffraction measurement.

FIG. 15A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%).

These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 15B:
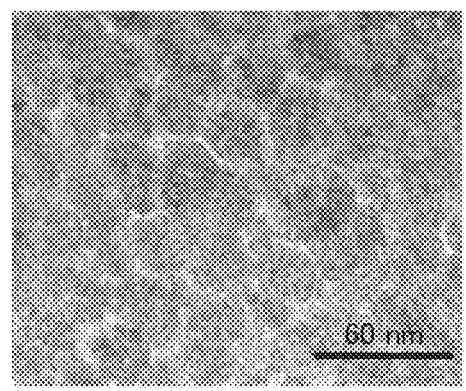
FIGS. 15B and 15C show plan-view TEM images.
Figure 15C:
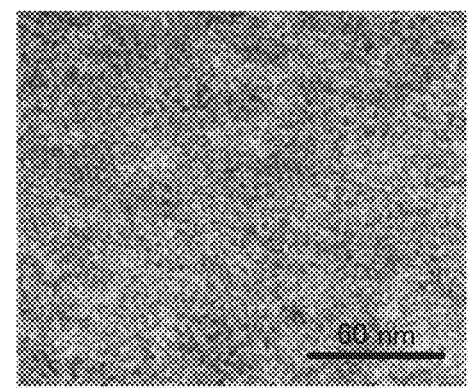

FIGS. 15B and 15C are plan-view TEM images of the CAAC-OS film obtained just after the deposition and the CAAC-OS film subjected to the heat treatment at 450° C., respectively. Comparison between FIGS. 15B and 15C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Note that the structures, methods, and the like described in this embodiment can be used as appropriate in combination with any of the structures, methods, and the like described in other embodiments.

Embodiment 3

In this embodiment, an example of a cross-sectional structure of a transistor used in a semiconductor device of one embodiment of the disclosed invention will be described with reference to drawings.

Figure 16:
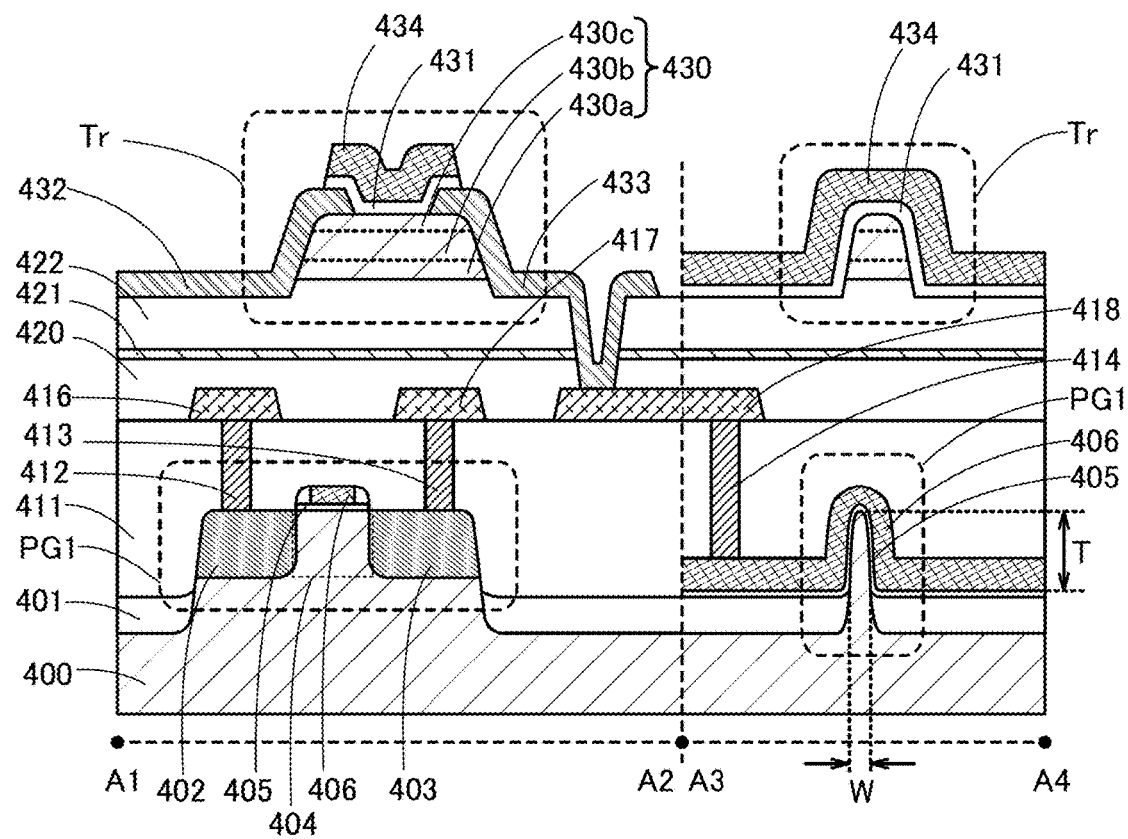
FIG. 16 is a cross-sectional view illustrating one embodiment of the present invention.

FIG. 16 illustrates an example of part of a cross-sectional structure of a circuit portion according to one embodiment of the invention. FIG. 16 illustrates an example of a cross-sectional structure of the transistor PG1 and the transistor Tr illustrated in FIG. 11A in Embodiment 1. A region along dashed line A1-A2 shows a structure of the transistors PG1 and Tr in the channel length direction, and a region along dashed line A3-A4 shows a structure of the transistors PG1 and Tr in the channel width direction. Note that in one embodiment of the present invention, the channel length direction of the transistor PG1 is not necessarily the same as the channel length direction of the transistor Tr.

The channel length direction refers to a direction in which a carrier moves between a pair of impurity regions functioning as a source region and a drain region by the most direct way, and the channel width direction refers to a direction perpendicular to the channel length direction.

In FIG. 16, the transistor Tr including a channel formation region in an oxide semiconductor film is formed over the transistor PG1 including a channel formation region in a single crystal silicon substrate.

The transistor PG1 may include the channel formation region in a semiconductor film or a semiconductor substrate of silicon, germanium, or the like in an amorphous, microcrystalline, polycrystalline, or single crystal state. Alternatively, the transistor PG1 may include the channel formation region in an oxide semiconductor film or an oxide semiconductor substrate. In the case where channel formation regions of all the transistors are included in an oxide semiconductor film or an oxide semiconductor substrate, the transistor Tr is not necessarily stacked over the transistor PG1, and the transistors Tr and PG1 may be formed in the same layer.

In the case where the transistor PG1 is formed using a thin silicon film, any of the following can be used in the thin film: amorphous silicon formed by a sputtering method or a vapor phase growth method such as a plasma-enhanced CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the transistor PG1 is formed can be, for example, a silicon substrate, a germanium substrate, or a silicon germanium substrate. In FIG. 16, a single crystal silicon substrate is used as the substrate 400.

The transistor PG1 is electrically isolated by an element isolation method. As the element isolation method, a trench isolation method (a shallow trench isolation (STI) method) or the like can be used. FIG. 16 illustrates an example where the trench isolation method is used to electrically isolate the transistor PG1. Specifically, in FIG. 16, the transistor PG1 is electrically isolated by element isolation using an element isolation region 401 formed in such a manner that an insulator including silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the transistor PG1 and a channel formation region 404 placed between the impurity regions 402 and 403 are provided. Further, the transistor PG1 includes an insulating film 405 covering the channel formation region 404 and a gate electrode 406 that overlaps with the channel formation region 404 with the insulating film 405 provided therebetween.

In the transistor PG1, a side portion and an upper portion of the projection in the channel formation region 404 overlap with the gate electrode 406 with the insulating film 405 positioned therebetween, so that carriers flow in a wide area including the side portion and the upper portion of the channel formation region 404. Therefore, an area over the substrate occupied by the transistor PG1 can be reduced, and the number of transferred carriers in the transistor PG1 can be increased. As a result, the on-state current and field-effect mobility of the transistor PG1 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor PG1 can be further increased and the field-effect mobility of the transistor PG1 can be further increased.

Note that when the transistor PG1 is formed using a bulk semiconductor substrate, the aspect ratio is preferably 0.5 or more, further preferably 1 or more.

An insulating film 411 is provided over the transistor PG1. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having a blocking effect of preventing diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421, and the transistor Tr is provided over the insulating film 422.

The transistor Tr includes, over the insulating film 422, a semiconductor film 430 including an oxide semiconductor, conductive films 432 and 433 functioning as a source and drain electrodes and electrically connected to the semiconductor film 430, a gate insulating film 431 covering the semiconductor film 430, and a gate electrode 434 overlapping with the semiconductor film 430 with the gate insulating film 431 positioned therebetween. Note that an opening is formed in the insulating films 420 to 422. The conductive film 433 is connected to the conductive film 418 in the opening.

Note that in FIG. 16, the transistor Tr includes at least the gate electrode 434 on one side of the semiconductor film 430, and may further include a gate electrode overlapping with the semiconductor film 430 with the insulating film 422 positioned therebetween.

In the case where the transistor Tr has a pair of gate electrodes, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 16, the transistor Tr has a single-gate structure where one channel formation region corresponding to one gate electrode 434 is provided. However, the transistor Tr may have a multi-gate structure where a plurality of electrically connected gate electrodes are provided so that a plurality of channel formation regions are included in one active layer.

FIG. 16 illustrates an example in which the semiconductor film 430 included in the transistor Tr includes oxide semiconductor films 430a to 430c that are stacked in this order over the insulating film 422. Note that in one embodiment of the present invention, the semiconductor film 430 of the transistor Tr may be formed using a single-layer metal oxide film.

The insulating film 422 preferably has a function of supplying part of oxygen to the oxide semiconductor films 430a to 430c by heating. It is preferable that the number of defects in the insulating film 422 be small, and typically the spin density at g=2.001 due to a dangling bond of silicon be lower than or equal to $1 \times 10^{18}$ spins/cm$^3$. The spin density is measured by electron spin resonance (ESR) spectroscopy.

The insulating film 422, which has a function of supplying part of the oxygen to the oxide semiconductor films 430a to 430c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor Tr illustrated in FIG. 16, the gate electrode 434 overlaps with end portions of the oxide semiconductor film 430b including a channel region that do not overlap with the conductive films 432 and 433, i.e., end portions of the oxide semiconductor film 430b that are in a region different from a region where the conductive films 432 and 433 are located. When the end portions of the oxide semiconductor film 430b are exposed to plasma by etching for forming the end portions, a chlorine radical, a fluorine radical, or other radicals generated from an etching gas are easily bonded to a metal element contained in an oxide semiconductor. For this reason, it can be considered that, in the end portions of the oxide semiconductor film, oxygen bonded to the metal element is easily released, so that an oxygen vacancy is easily formed; thus, the oxide semiconductor film easily has n-type conductivity. However, an electric field applied to the end portions can be controlled by controlling the potential of the gate electrode 434 because the end portions of the oxide semiconductor film 430b that do not overlap with the conductive films 432 and 433 overlap with the gate electrode 434 in the transistor Tr illustrated in FIG. 16. Consequently, current that flows between the conductive films 432 and 433 through the end portions of the oxide semiconductor film 430b can be controlled by the potential applied to the gate electrode 434. Such a structure of the transistor Tr is referred to as a surrounded channel (s-channel) structure.

With the s-channel structure, specifically, when a potential at which the transistor Tr is turned off is supplied to the gate electrode 434, the amount of off-state current that flows between the conductive films 432 and 433 through the end portions can be reduced. For this reason, in the transistor Tr, even when the distance between the conductive films 432 and 433 at the end portions of the oxide semiconductor film 430b is reduced as a result of reducing the channel length to obtain high on-state current, the transistor Tr can have low off-state current. Consequently, with the short channel length, the transistor Tr can have high on-state current when in an on state and low off-state current when in an off state.

With the s-channel structure, specifically, when a potential at which the transistor Tr is turned on is supplied to the gate electrode 434, the amount of current that flows between the conductive films 432 and 433 through the end portions of the oxide semiconductor film 430b can be increased. The current contributes to an increase in the field-effect mobility and the on-state current of the transistor Tr. When the end portions of the oxide semiconductor film 430b overlap with the gate electrode 434, carriers flow in a wide region of the oxide semiconductor film 430b without being limited to a region in the vicinity of the interface between the oxide semiconductor film 430b and the gate insulating film 431, which results in an increase in the amount of carrier movement in the transistor Tr. As a result, the on-state current of the transistor Tr is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is the apparent field-effect mobility in a saturation region of the transistor, which is an index of current drive capability.

Figure 19:
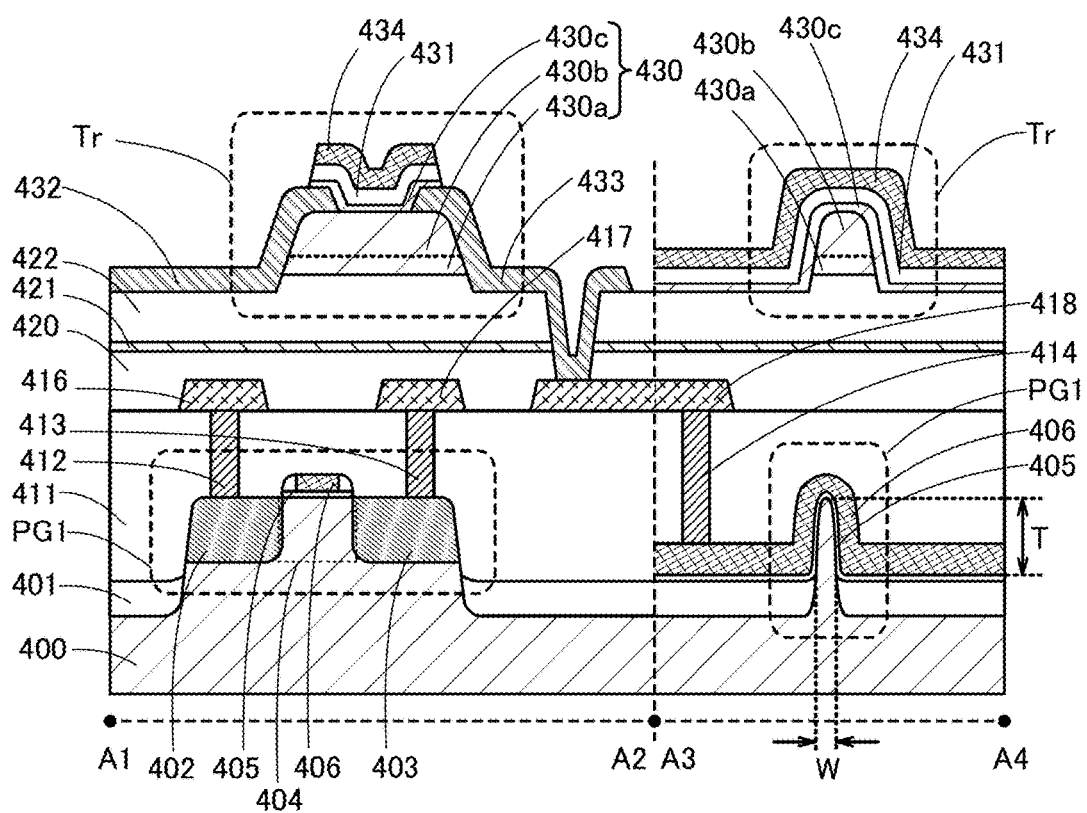
FIG. 19 is a cross-sectional view illustrating one embodiment of the present invention.

Although this embodiment is described with reference to FIG. 16, one embodiment of the present invention is not limited to this structure. For example, a structure illustrated in FIG. 19 may be employed.

Note that the structures, methods, and the like described in this embodiment can be used as appropriate in combination with any of the structures, methods, and the like described in other embodiments.

Embodiment 4

Although the conductive films and the semiconductor films which are described in any of the above embodiments can be formed by a sputtering method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The conductive films and the semiconductor films which are described in the above embodiments can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is In(CH$_3$)$_3$. The chemical formula of trimethylgallum is Ga(CH$_3$)$_3$. The chemical formula of dimethylzinc is Zn(CH$_3$)$_2$. Without limitation to the above combination, triethylgallium (chemical formula: Ga(C$_2$H$_5$)$_3$) can be used instead of trimethylgallium and diethylzinc (chemical formula: Zn(C$_2$H$_5$)$_2$) can be used instead of dimethylzinc.

For example, in the case where a tungsten film is formed using a deposition apparatus employing ALD, a WF$_6$ gas and a B$_2$H$_6$ gas are sequentially introduced a plurality of times to form an initial tungsten film, and then a WF$_6$ gas and an H$_2$ gas are introduced at a time, so that a tungsten film is formed. Note that an SiH$_4$ gas may be used instead of a B$_2$H$_6$ gas.

For example, in the case where an oxide semiconductor film, e.g., an In—Ga—Zn—O film is formed using a deposition apparatus employing ALD, an In(CH$_3$)$_3$ gas and an O$_3$ gas are sequentially introduced a plurality of times to form an In—O layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Furthermore, a Zn(CH$_3$)$_2$ gas may be used.

The structure described above in this embodiment can be combined with any of the structures described in the other embodiments as appropriate.

Embodiment 5

In this embodiment, application examples of the semiconductor device described in the foregoing embodiment to an electronic component and to an electronic device including the electronic component will be described with reference to FIGS. 17A and 17B and FIGS. 18A to 18E.

Figure 17A:
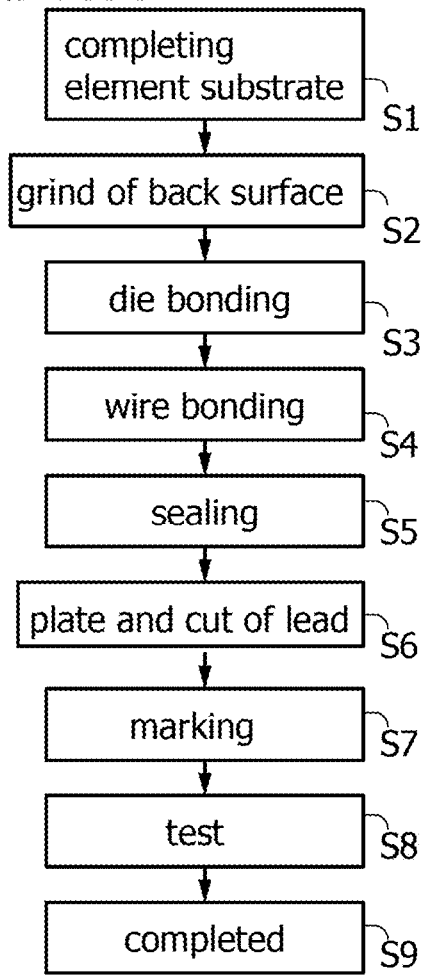
FIG. 17A is a flow chart illustrating steps of manufacturing a semiconductor device.

FIG. 17A shows an example where the semiconductor device described in the foregoing embodiment is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A semiconductor device including the transistors illustrated in FIG. 16 of Embodiment 3 is completed by integrating detachable components on a printed circuit board through the assembly process (post-process).

The post-process can be completed through steps shown in FIG. 17A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate and separating the substrate into a plurality of chips is performed. Then, a die bonding step of individually picking up separate chips to be mounted on and bonded to a lead frame is performed (Step S3). In this die bonding step, the chip is bonded to the lead frame by an appropriate method depending on a product, for example, bonding with a resin or a tape. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, so that the mounted circuit portion and wire can be protected from external mechanical force and deterioration of characteristics due to moisture or dust can be reduced.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

Since the electronic component described above includes the semiconductor device of the foregoing embodiment, it is possible to reduce the off-state current without use of an additionally generated negative potential and to increase the on-state current without application of a separately generated positive potential to a gate of an OS transistor. Therefore, the size and power consumption of the electronic component are reduced.

Figure 17B:
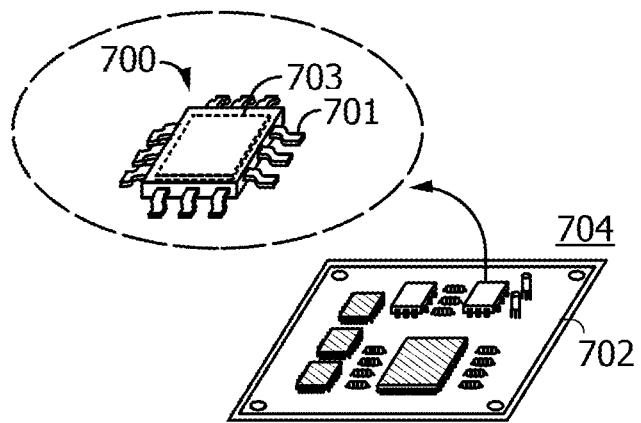
FIG. 17B is a perspective schematic diagram of the semiconductor device.

FIG. 17B is a perspective schematic diagram of a completed electronic component. FIG. 17B shows a perspective schematic diagram of a quad flat package (QFP) as an example of the electronic component. An electronic component 700 illustrated in FIG. 17B includes a lead 701 and a semiconductor device 703. The electronic component 700 in FIG. 17B is, for example, mounted on a printed circuit board 702. A plurality of electronic components 700 are used in combination and electrically connected to each other over the printed wiring board 702; thus, a substrate on which the electronic components are mounted (a circuit board 704) is completed. The completed circuit board 704 is provided in an electronic device or the like.

Next, the description is made on applications of the above electronic component to electronic devices such as a computer, a portable information appliance (including a mobile phone, a portable game machine, and an audio reproducing device), electronic paper, a television device (also referred to as television or television receiver), and a digital video camera.

Figure 18A:
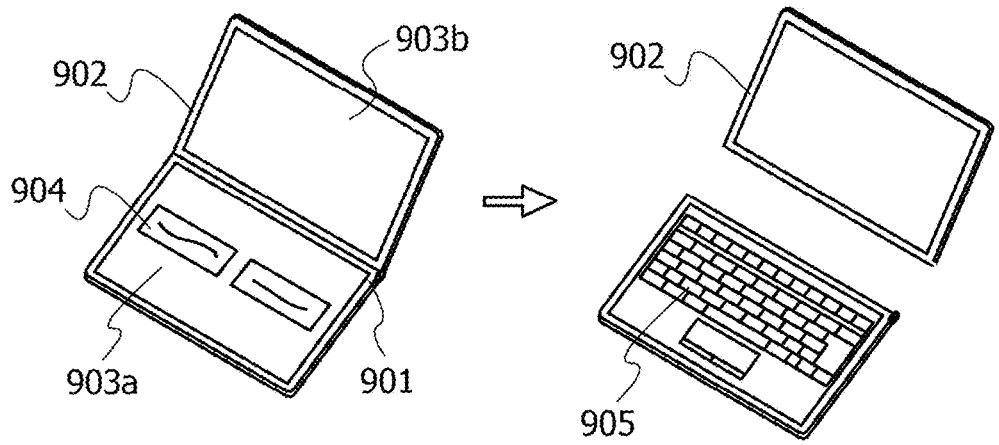
FIGS. 18A to 18E illustrate electronic devices using semiconductor devices.

FIG. 18A illustrates a portable information appliance that includes a housing 901, a housing 902, a first display portion 903a, a second display portion 903b, and the like. At least one of the housings 901 and 902 includes the circuit board including the semiconductor device of the foregoing embodiment. Thus, it is possible to obtain a portable information appliance including the electronic component with reduced size and reduced power consumption.

Note that the first display portion 903a is a panel having a touch input function, and for example, as illustrated in the left of FIG. 18A, which of "touch input" and "keyboard input" is performed can be selected with a selection button 904 displayed on the first display portion 903a. Since selection buttons with a variety of sizes can be displayed, the information appliance can be easily used by people of any generation. For example, when "keyboard input" is selected, a keyboard 905 is displayed on the first display portion 903a as illustrated in the right of FIG. 18A. Thus, letters can be input quickly by key input as in the case of using a conventional information appliance, for example.

One of the first display portion 903a and the second display portion 903b can be detached from the portable information appliance as shown in the right of FIG. 18A. Providing the second display portion 903b with a touch input function makes the information appliance convenient to carry because the weight can be further reduced and the information appliance can be operated with one hand while the other hand supports the housing 902.

The portable information appliance in FIG. 18A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 18A may transmit and receive data wirelessly. Through wireless communication, desired book data or the like can be purchased and downloaded from an e-book server.

In addition, the housing 902 illustrated in FIG. 18A may be equipped with an antenna, a microphone function, or a wireless communication function to be used as a mobile phone.

Figure 18B:
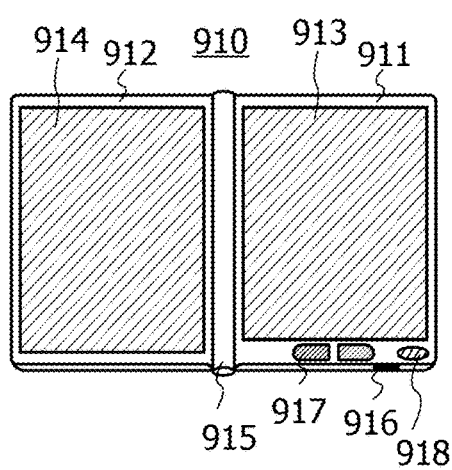

FIG. 18B illustrates an e-book reader 910 in which electronic paper is incorporated. The e-book reader 910 has two housings of a housing 911 and a housing 912. The housing 911 and the housing 912 are provided with a display portion 913 and a display portion 914, respectively. The housings 911 and 912 are connected by a hinge 915 and can be opened or closed with the hinge 915 as an axis. The housing 911 is provided with a power switch 916, an operation key 917, a speaker 918, and the like. The circuit board including the semiconductor device of the foregoing embodiment is provided in at least one of the housings 911 and 912. Consequently, it is possible to obtain an e-book reader including the electronic component with reduced size and reduced power consumption.

Figure 18C:
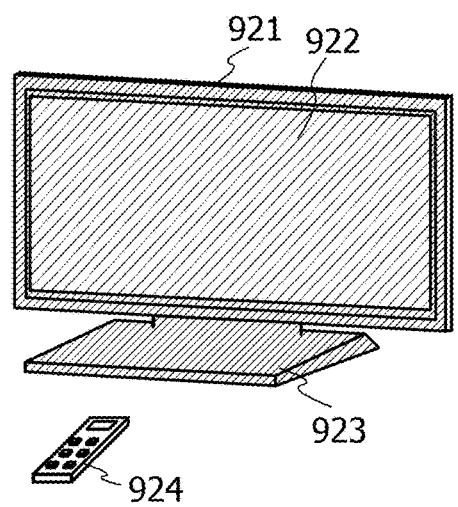

FIG. 18C illustrates a television device including a housing 921, a display portion 922, a stand 923, and the like. The television device can be operated with a switch of the housing 921 and a separate remote controller 924. The circuit board including the semiconductor device of the foregoing embodiment is mounted on the housing 921 and the remote controller 924. Thus, it is possible to obtain a television device including the electronic component with reduced size and reduced power consumption.

Figure 18D:
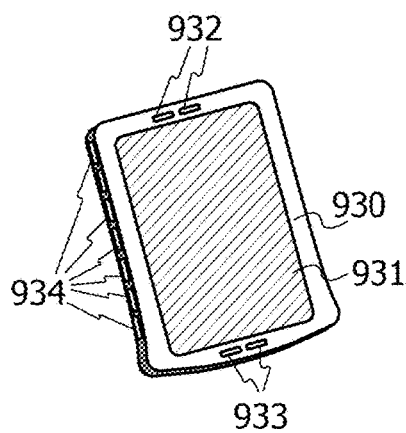

FIG. 18D illustrates a smartphone in which a main body 930 is provided with a display portion 931, a speaker 932, a microphone 933, operation buttons 934, and the like. The circuit board including the semiconductor device of the foregoing embodiment is provided in the main body 930. Thus, it is possible to obtain a smartphone including the electronic component with reduced size and reduced power consumption.

Figure 18E:
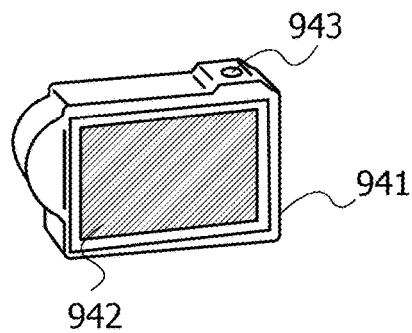

FIG. 18E illustrates a digital camera including a main body 941, a display portion 942, an operation switch 943, and the like. The circuit board including the semiconductor device of the foregoing embodiment is provided in the main body 941. Thus, it is possible to obtain a digital camera including the electronic component with reduced size and reduced power consumption.

As described above, the electronic devices shown in this embodiment incorporate the circuit board including the semiconductor device of the foregoing embodiment. Consequently, it is possible to obtain the electronic devices which include the electronic component with reduced size and reduced power consumption.

This application is based on Japanese Patent Application serial No. 2013-234761 filed with Japan Patent Office on Nov. 13, 2013, the entire contents of which are hereby incorporated by reference.

What is claimed is:

1. A semiconductor device comprising:
a first memory cell; and
a second memory cell,
wherein each of the first memory cell and the second memory cell comprises:
a transistor comprising a gate, a first terminal, and a second terminal;
a volatile memory circuit electrically connected to the first terminal and a bit line; and
a capacitor comprising a first electrode electrically connected to the second terminal and a second electrode electrically connected to a potential control line,
wherein the volatile memory circuits of the first and second memory cells are directly connected to a same word line,
wherein the volatile memory circuit of the first memory cell is configured to store a datum in a first period,
wherein a node between the transistor and the capacitor of the first memory cell is configured to store the datum in a second period,
wherein the potential control line is set at a low power supply potential when the transistor of the first memory cell is in an on state in the first period, and
wherein the potential control line is set at a high power supply potential when the transistor of the first memory cell is in an off state in the second period.

2. The semiconductor device according to claim 1, wherein the high power supply potential and the low power supply potential are supplied to the volatile memory circuit of the first memory cell in the first period, and
wherein the high power supply potential is supplied to the volatile memory circuit of the first memory cell and a supply of the low power supply potential to the first memory cell is stopped in the second period.

3. The semiconductor device according to claim 1, wherein the transistor comprises a semiconductor layer containing an oxide semiconductor.

4. The semiconductor device according to claim 1, wherein the transistor is a first transistor, and wherein each of the volatile memory circuits of the first and second memory cells comprises a second transistor including a semiconductor layer containing silicon.

5. The semiconductor device according to claim 4, wherein the first transistor is stacked over the second transistor.

6. The semiconductor device according to claim 1, wherein each of the volatile memory circuits of the first and second memory cells is a static random access memory.

7. The semiconductor device according to claim 1, wherein each of the volatile memory circuits of the first and second memory cells is a flip-flop.

8. A semiconductor device comprising:
a first memory cell; and
a second memory cell,
wherein each of the first memory cell and the second memory cell comprises:
a first transistor comprising a gate, a first terminal, and a second terminal;
a second transistor comprising a gate, a first terminal, and a second terminal;
a volatile memory circuit electrically connected to the first terminal of the first transistor and a bit line; and
a capacitor comprising a first electrode electrically connected to the second terminal of the first transistor and a second electrode electrically connected to a potential control line,
a high power supply line electrically connected to the volatile memory circuit of the first memory cell; and
a low power supply line electrically connected to the volatile memory circuit of the first memory cell through the second transistor of the first memory cell,
wherein the volatile memory circuits of the first and second memory cells are directly connected to a same word line,
wherein the volatile memory circuit of the first memory cell is configured to store a datum in a first period,
wherein a node between the first transistor and the capacitor of the first memory cell is configured to store the datum in a second period,
wherein the potential control line is set at a low power supply potential when the first and second transistors of the first memory cell are in an on state in the first period, and
wherein the potential control line is set at a high power supply potential when the first and second transistors of the first memory cell are in an off state in the second period.

9. The semiconductor device according to claim 8, wherein the first transistor comprises a semiconductor layer containing an oxide semiconductor.

10. The semiconductor device according to claim 8, wherein each of the volatile memory circuits of the first and second memory cells comprises a third transistor including a semiconductor layer containing silicon.

11. The semiconductor device according to claim 10, wherein the first transistor is stacked over the third transistor.

12. The semiconductor device according to claim 8, wherein each of the volatile memory circuits of the first and second memory cells is a static random access memory.

13. The semiconductor device according to claim 8, wherein each of the volatile memory circuits of the first and second memory cells is a flip-flop.

14. A method for driving a semiconductor device comprising a first memory cell and a second memory cell, each of the first memory cell and the second memory cell comprising:

a transistor comprising a gate, a first terminal, and a second terminal;
a volatile memory circuit electrically connected to the first terminal and a bit line; and
a capacitor comprising a first electrode electrically connected to the second terminal and a second electrode electrically connected to a potential control line,
wherein the volatile memory circuits of the first and second memory cells are directly connected to a same word line,
the method comprising the steps of:
   setting the potential control line at a low power supply potential and supplying a potential of the first terminal to the second terminal through the transistor of the first memory cell in an on state;
   retaining the potential of the first terminal at the second terminal of the first memory cell by turning off the transistor;
   raising a potential of the second terminal of the first memory cell by switching the potential control line from the low power supply potential to a high power supply potential when the transistor of the first memory cell is in an off state; and
   stopping a supply of the low power supply potential to the volatile memory circuit of the first memory cell.

15. The method for driving a semiconductor device according to claim 14, wherein the supply of the low power supply potential is stopped by bringing a wiring to which the low power supply potential is supplied into an electrically floating state.

* * * * *